(12) United States Patent
Park et al.

(10) Patent No.: US 11,119,046 B2
(45) Date of Patent: Sep. 14, 2021

(54) SUBSTRATE WITH SLIDING DIELECTRIC FILM AND METHOD OF MANUFACTURING THE SAME

(71) Applicant: Korea Institute of Machinery & Materials, Daejeon (KR)

(72) Inventors: Sung-Gyu Park, Changwon-si (KR); Dong-Ho Kim, Busan (KR); Ho-Sang Jung, Gangnam-gu (KR)

(73) Assignee: KOREA INSTITUTE OF MACHINERY & MATERIALS, Gyeongsangnam-do (KR)

( * ) Notice: Subject to any disclaimer, the term of this patent is extended or adjusted under 35 U.S.C. 154(b) by 0 days.

(21) Appl. No.: 16/176,780

(22) Filed: Oct. 31, 2018

(65) Prior Publication Data

US 2019/0331605 A1    Oct. 31, 2019

(30) Foreign Application Priority Data

Apr. 26, 2018 (KR) .................. 10-2018-0048785

(51) Int. Cl.
*B82Y 30/00* (2011.01)
*G01N 21/65* (2006.01)
(Continued)

(52) U.S. Cl.
CPC .............. *G01N 21/658* (2013.01); *B81B 5/00* (2013.01); *B81C 1/00349* (2013.01);
(Continued)

(58) Field of Classification Search
CPC ...... B32B 15/01; B32B 15/04; G01N 21/658; G01J 3/44
(Continued)

(56) References Cited

FOREIGN PATENT DOCUMENTS

| JP | 2015-163845 A | 9/2015 |
|----|---------------|--------|
| JP | 2015163845 A * | 9/2015 |

(Continued)

OTHER PUBLICATIONS

Yoon et al., KR 20160038207 A, machine translation, Apr. 2016, entire machine translation (Year: 2016).*
(Continued)

*Primary Examiner* — Humera N. Sheikh
*Assistant Examiner* — Katherine A Christy
(74) *Attorney, Agent, or Firm* — Harness, Dickey & Pierce, P.L.C.

(57) ABSTRACT

A substrate formed by using a sliding dielectric film with a low surface energy that activates surface migration of metal adatoms and a method of manufacturing the same. More particularly, a substrate with a sliding dielectric film includes a substrate; a sliding dielectric film with a low surface energy formed on the substrate; and a nanoparticle formed on the sliding dielectric film, wherein the surface energy of the nanoparticle is at least 1000 mJ/m$^2$ greater than the surface energy of the sliding dielectric film. The substrate has a very high SERS enhancement factor with low light loss characteristics in the entire visible region by maximizing the plasmonic coupling between highly-dense and spaced-apart nanoparticles and between the lower substrate and the upper nanoparticles.

18 Claims, 52 Drawing Sheets

(51) Int. Cl.
    *G01J 3/44*     (2006.01)
    *B81B 5/00*     (2006.01)
    *B81C 1/00*     (2006.01)
    *B82Y 40/00*     (2011.01)

(52) U.S. Cl.
    CPC ............... *B82Y 30/00* (2013.01); *B82Y 40/00* (2013.01); *G01J 3/44* (2013.01)

(58) Field of Classification Search
    USPC .................................. 428/621, 615, 672, 674
    See application file for complete search history.

(56) References Cited

FOREIGN PATENT DOCUMENTS

| KR | 2016-0038207 A | | 4/2016 | |
|----|----|----|----|----|
| KR | 20160038207 A | * | 4/2016 | |
| KR | 101639686 B1 | | 7/2016 | |
| WO | WO-2017200295 A1 | * | 11/2017 | ............. G01N 21/25 |

OTHER PUBLICATIONS

Miki et al., JP 2015163845 A, machine translation, Sep. 2015, entire machine translation (Year: 2015).*
Guisbiers et al., "Use of Chemical Functionalities to Control Stability of Nanoparticles," Jan. 2017, URL: <https://www.researchgate.net/publication/319266895_Use_of_Chemical_Functionalities_to_Control_Stability_of_Nanoparticles>, pp. 1-11 (Year: 2017).*
Castro et al., "Surface Energy and Thermodynamic Stability of gamma-Alumina: Effect of Dopants and Water," Jan. 31, 2006, URL: <https://pubs.acs.org/doi/pdf/10.1021/cm052599d>, pp. 1867-1872 (Year: 2006).*
Beak et al., WO 2017/200295 A1 machine translation, Nov. 23, 2017, entire machine translation (Year: 2017).*
Office Action for corresponding Korean Application No. 10-2018-0048785 dated May 21. 2019 and English translation thereof.
Rohit Chikkaraddy, "single-molecule strong coupling at room temperature in plasmonic nanocavities" in Nature, 2016, 535, 127-130.
MinKyoung Lee, "3D multilayered plasmonic nanostructures with high areal density for SERS" in RSC Advances, 2017, 7, 17896-17905.

* cited by examiner

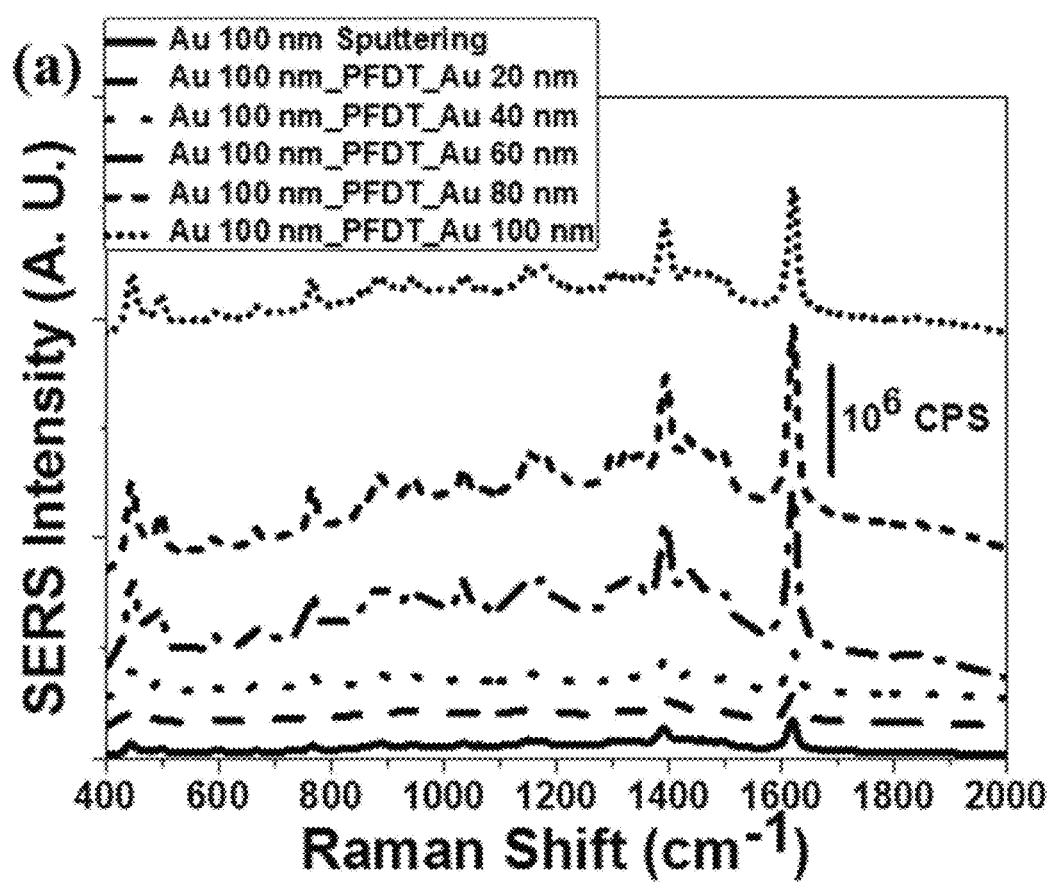

SUBSTRATE WITH SLIDING DIELECTRIC FILM AND METHOD OF MANUFACTURING THE SAME

CROSS-REFERENCE TO RELATED APPLICATION(S)

This application claims the benefit under 35 USC 119(a) of Korean Patent Application No. 10-2018-0048785, filed on Apr. 26, 2018 in the Korean Intellectual Property Office, the entire disclosure of which is incorporated herein by reference for all purposes.

BACKGROUND

1. Field

The following description relates to a substrate with a sliding dielectric film and a method of manufacturing the same. More particularly, it relates to a substrate with a sliding dielectric film with a low surface energy that activates surface migration of adatoms and a method of manufacturing the same.

2. Description of Related Art

Plasmonic metal nanoparticles such as gold, silver, and copper and metal nanostructures induce localized surface plasmon resonance (LSPR) by incident light. This LSPR phenomenon has been used for label-free biosensors and plasmon-enhanced Raman/fluorescence/IR spectroscopy sensors. The enhancement factor of the Raman signal of a molecule exponentially increases as the distance (nano-gap) between metal nanoparticles and nanostructures decreases. It is known that the plasmonic field is maximized at 1 nm nano-gaps between metal nanostructures and the Raman signal of a molecule to be determined increases to the maximum when a molecule is present at the 1 nm nano-gap.

Conventional techniques for forming a noble metal nano-structure having a nano-gap of a 1 nm level are as follows: (1) a two-dimensional multi-layered metal nanostructured substrate is prepared by forming a metal film and a dielectric film on a flat substrate of a metal multi-layer structure, and coating metal nanoparticles formed in an aqueous solution or vacuum depositing metal nanoparticles; (2) a three-dimensional multi-layered metal nanostructured substrate is prepared by continuously vacuum depositing a metal film, an dielectric film, and noble metal nanoparticles on a substrate on which polymer nano-protrusions are formed.

The method (1) is disclosed in "single-molecule strong coupling at room temperature in plasmonic nanocavities" in Nature, 2016, 535, 127-130. Referring to FIG. 1, the method includes forming a flat Au film by vacuum depositing Cr 5 nm/Au 70 nm on a flat Si substrate, forming a porous dielectric film (Cucurbituril) having a thickness of 0.9 nm as a dielectric film, and applying Au nanoparticles having a size distribution of 40-60 nm formed in an aqueous solution. Since cucurbituril can accommodate only one methylene blue molecule inside, a surface-enhanced Raman scattering (SERS) peak of a single methylene blue molecule can be detected due to strong electromagnetic field (plasmonic coupling effect), which is formed between the Au nanoparticle and the Au film.

The method (2) is disclosed in "substrate which have multiple nano-gaps and fabricating method for the same" in KR Patent No. 10-1639686 and "3D multilayered plasmonic nanostructures with high areal density for SERS" in RSC Advances, 2017, 7, 17896-17905.

In both documents, a three-dimensional multi-layered metal nanostructured substrate is formed by continuously vacuum-depositing Ag 50 nm, $Al_2O_3$ 10 nm, Ag nanoparticles on a polydimethylsiloxane (PDMS) protrusion substrate formed by plasma surface treatment. Since the oxide film ($Al_2O_3$) used has a very high surface energy of 905 $mJ/m^2$, surface migration of metal adatoms is restricted to improve plasmonic properties during vacuum deposition of Ag (1140 $mJ/m^2$), which has surface energy difference of only 235 $mJ/m^2$ from the oxide film, so that a metal film is formed at a deposition thickness of 40 nm or greater, instead of forming spaced-apart metal nanoparticles.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An object of this disclosure is to provide a substrate with a sliding dielectric film having a low surface energy that activates surface migration of adatoms.

Another object of this disclosure is to provide a method of manufacturing a substrate with improved plasmonic properties which can increase density of nanoparticles being spaced-apart from each other even when a deposition thickness is increased by activating surface migration of adatoms.

The substrate with high dense nanoparticles and improved plasmonic properties may include a substrate comprising a two-dimensional film and a three-dimensional nanostructure; a sliding dielectric film with a low surface energy formed on the substrate; and a nanoparticle formed on the sliding dielectric film with a low surface energy, wherein difference in the surface energy between the sliding dielectric film and the nanoparticle is 1000 $mJ/m^2$ or higher.

According to an aspect of this disclosure, there is provided a substrate with a sliding dielectric film including: a substrate; a sliding dielectric film with a low surface energy formed on the substrate; a nanoparticle formed on the sliding dielectric film, wherein the surface energy of the nanoparticle is at least 1000 $mJ/m^2$ greater than the surface energy of the sliding dielectric film.

According to an embodiment of this disclosure, the surface energy of the sliding dielectric film may be 100 $mJ/m^2$ or less.

According to an embodiment of this disclosure, the sliding dielectric film may be formed of at least one chosen from alkanethiol, alkyldisulfide, fluorocarbon thiol, fluorocarbon silane, chlorocarbon silane, fluorocarbon carboxylic acid, fluorocarbon amine, fluorocarbon polymer and a derivative thereof.

According to an embodiment of this disclosure, the substrate having a sliding dielectric film may have a water contact angle of 90° or more.

According to an embodiment of this disclosure, a thickness of the sliding dielectric film may be 0.5 nm to 100 nm.

According to an embodiment of this disclosure, the sliding dielectric film may be formed by vapor deposition or solution process.

According to an embodiment of this disclosure, the substrate may be formed of polymer, glass, ceramic, metal, paper, resin, silicon, or metal oxide.

According to an embodiment of this disclosure, the substrate with a sliding dielectric film may further include a nanostructure formed on the surface of the substrate being spaced-apart from each other.

According to an embodiment of this disclosure, the nanostructure may be formed by plasma etching, soft lithography, nanoimprint lithography, photo lithography, or holographic lithography.

According to an embodiment of this disclosure, the substrate with a sliding dielectric film may further include a first metal-containing thin film formed on the surface of at least one of the substrate and the nanostructure.

According to an embodiment of this disclosure, the first metal-containing thin film may be formed by vacuum depositing a Raman active material.

According to an embodiment of this disclosure, the Raman active material of the first metal-containing thin film may be Au, Ag, or an alloy thereof.

According to an embodiment of this disclosure, the first metal-containing thin film may be formed by vacuum depositing a Raman active material to a thickness of 10 nm or more.

According to an embodiment of this disclosure, the substrate with a sliding dielectric film may further include a second metal-containing thin film between the substrate and the first metal-containing thin film, wherein the second metal-containing thin film has a lower surface energy than the first metal-containing thin film.

According to an embodiment of this disclosure, the second metal-containing thin film may be formed of one chosen from Ag, Cu, Pt, Pd, Ti, and an alloy thereof.

According to an embodiment of this disclosure, the nanoparticle may be metal-containing nanoparticle.

According to an embodiment of this disclosure, the nanoparticle may be formed by vacuum depositing a Raman active material.

According to an embodiment of this disclosure, the Raman active material of the nanoparticle may be Au, Ag, or an alloy thereof.

According to an embodiment of this disclosure, the nanoparticle may have an average particle size of 40 nm or greater.

According to another aspect of this disclosure, there is provided a method for manufacturing a substrate with a sliding dielectric film including: forming a substrate; forming a sliding dielectric film with a low surface energy on the substrate; and forming a nanoparticle on the sliding dielectric film, wherein the surface energy of the nanoparticle is at least 1000 mJ/m$^2$ greater than the surface energy of the sliding dielectric film.

According to an embodiment of this disclosure, the sliding dielectric film with a low surface energy may be included to activate surface migration of adatoms.

It may increase the density of the nanoparticles being spaced-apart even when a deposition thickness is increased by activating surface migration of adatoms, thereby providing a substrate having improved plasmonic properties.

According to another general aspect, there is provided an ultra-sensitive plasmon-enhanced spectroscopic substrate and a method for manufacturing the same, wherein a multi-layered metal nanostructure having a SERS enhancement factor of 10$^8$ or more and a low light loss of 1% or less is formed by forming a three-dimensional high-density metal nanostructure and nanoparticle.

Other features and aspects will be apparent from the following detailed description, the drawings, and the claims.

BRIEF DESCRIPTION OF THE DRAWINGS

FIGS. 14A and 14B are graphs comparing SERS peaks measured after dropping 3 µL of 5 µM methylene blue solution on a SERS substrate formed according to an embodiment of this disclosure and drying the result.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
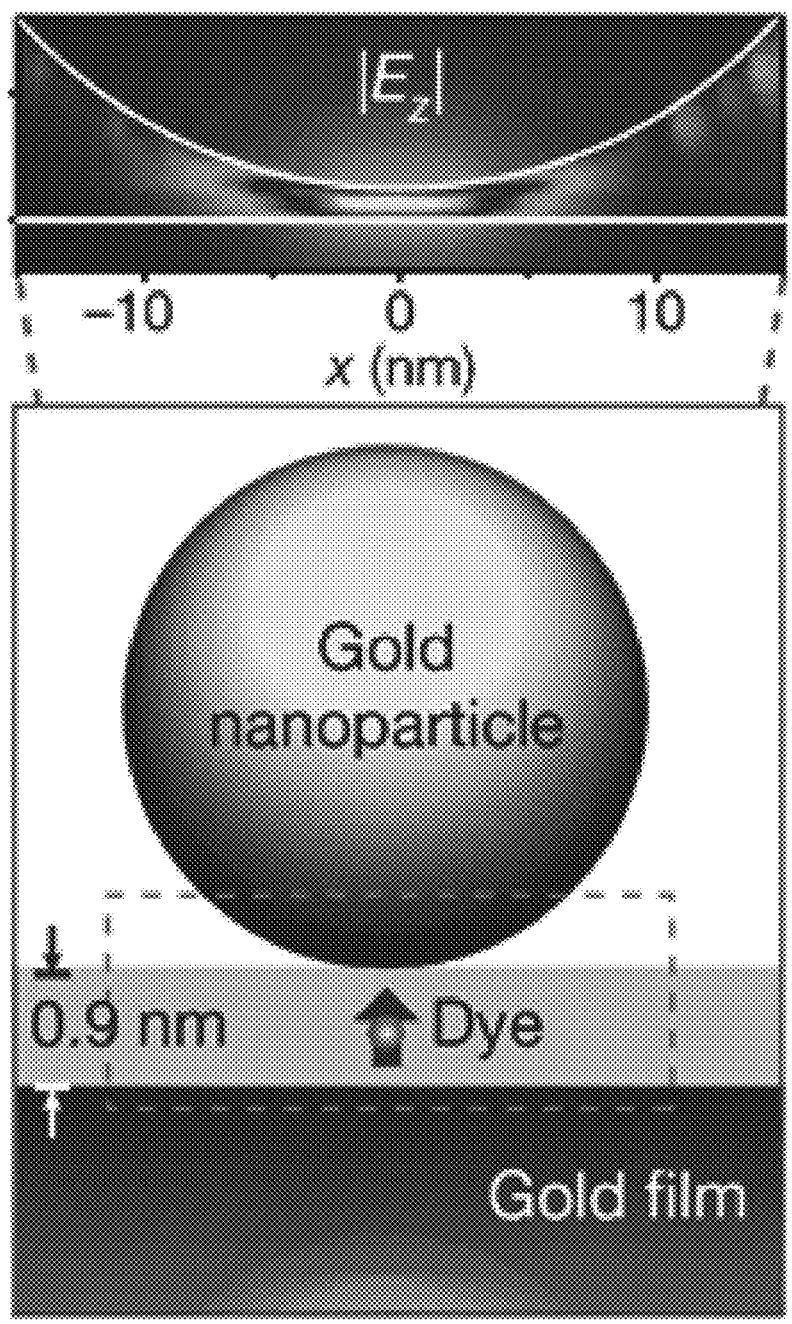
FIG. 1 illustrates an example of a conventional multi-layered metal nanostructured substrate.
Figure 2A:
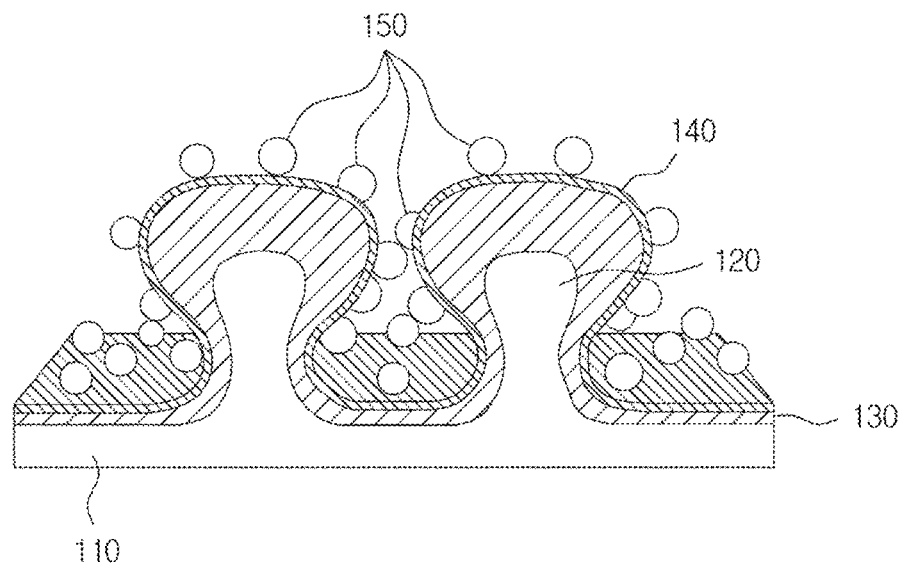
FIGS. 2A, 2B, 2C, 2D, and 2E illustrate an example of a conventional three-dimensional multi-layered metal nanostructured substrate.
Figure 2B:
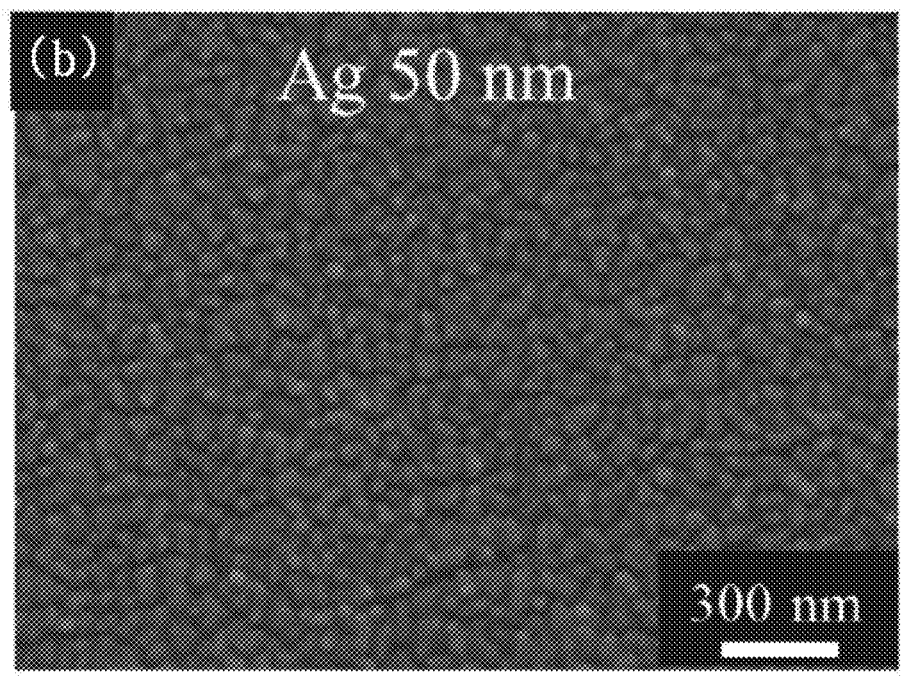
Figure 2C:
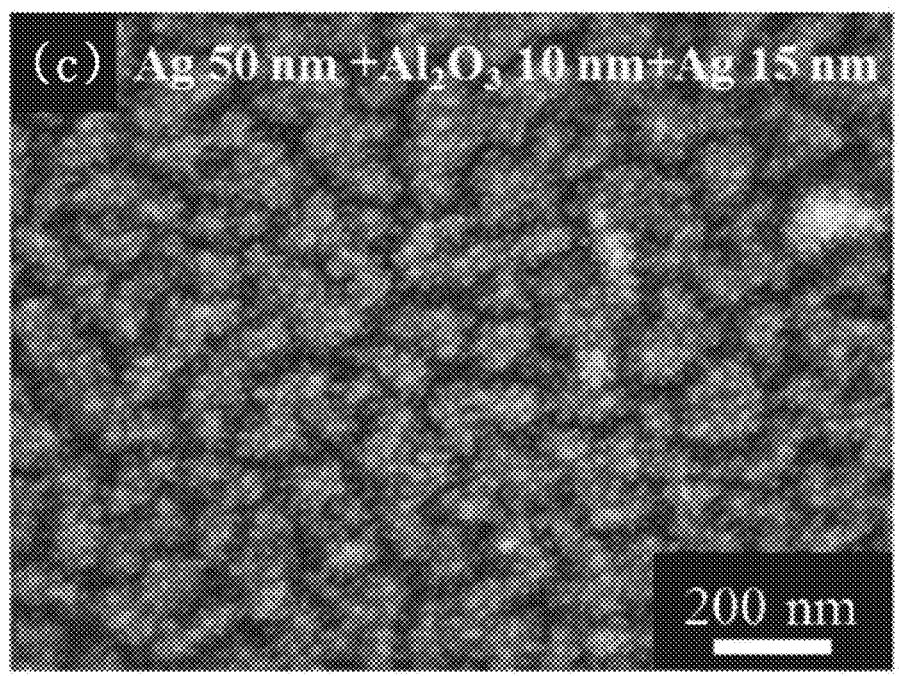
Figure 2D:
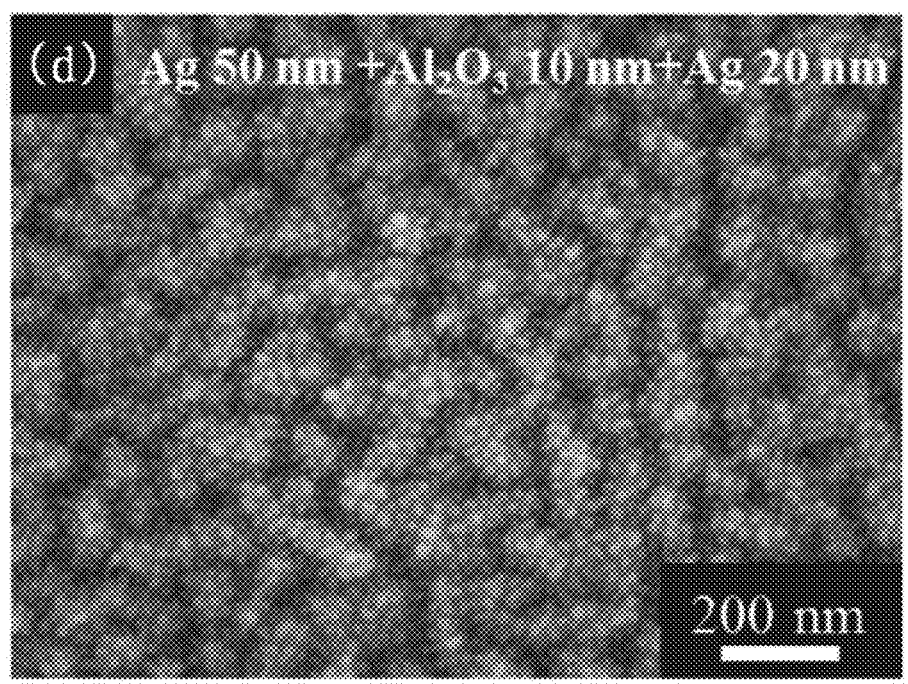
Figure 2E:
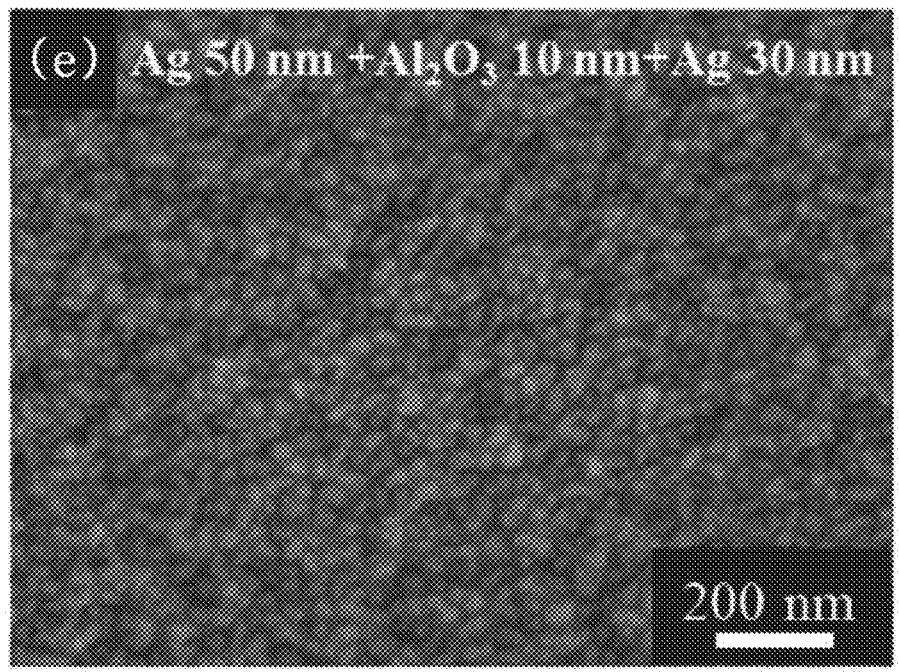

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms such as "first", "second", "upper" and "lower" are be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

When one element is described as being "connected" or "accessed" to another element, it shall be construed as being connected or accessed to the other element directly but also as possibly having another element in between.

The terms used in the description are intended to describe certain embodiments only, and shall by no means restrict the present disclosure. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

In this specification, when a part is referred to "including" an element, it is to be understood that it may further include other elements as well, without departing from the other elements unless specifically stated otherwise. Also, throughout the specification, the term "on" means to be located above or below an object and does not necessarily mean that it is located on an object with respect to the gravitational direction.

Hereinafter, embodiments of the disclosure will be described below in more detail with reference to the accompanying drawings, in which those components are rendered the same reference number that are the same or are in correspondence, regardless of the figure number, and redundant explanations are omitted.

Figure 3:
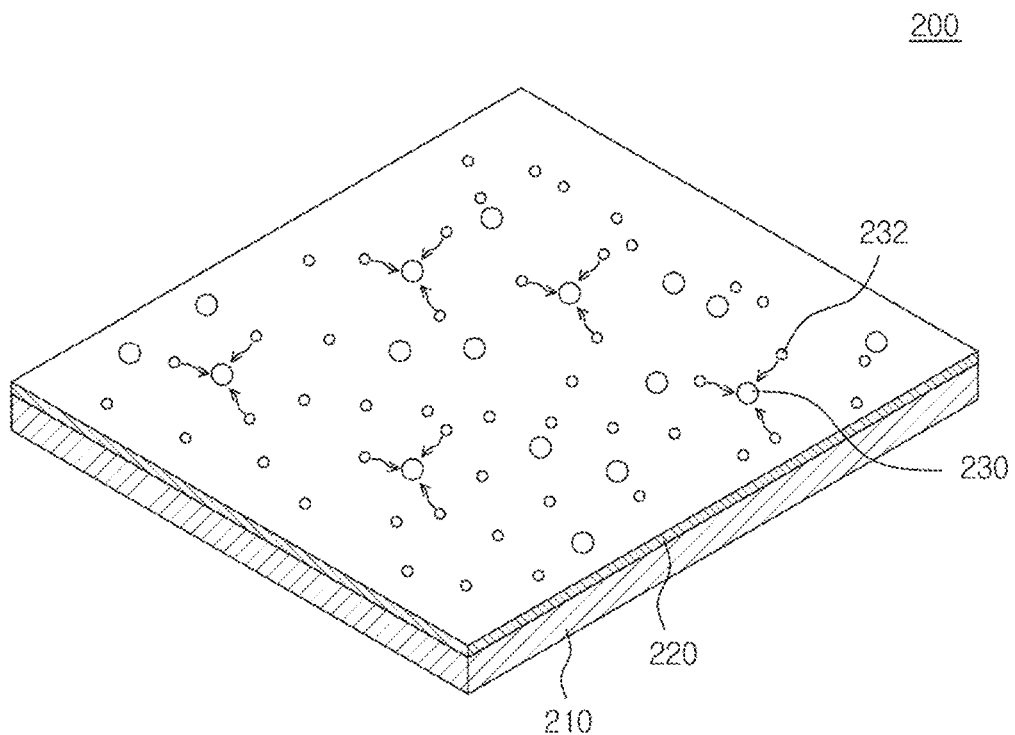
FIG. 3 is a schematic view illustrating a substrate with a sliding dielectric film according to an embodiment of this disclosure.

FIG. 3 is a schematic view illustrating a substrate with a sliding dielectric film according to an embodiment of this disclosure.

Referring to FIG. 3, a substrate with a sliding dielectric film 200 includes a substrate 210; a sliding dielectric film 220 having a low surface energy formed on the substrate 210; and a nanoparticle 230 formed on the sliding dielectric film 220, wherein surface energy of the nanoparticle 230 is at least 1000 mJ/m$^2$ greater than surface energy of the sliding dielectric film 220.

The substrate 210 may include both a two-dimensional film and a three-dimensional nanostructure. The substrate 210 may be formed of polymer, glass, ceramic, metal, paper, resin, silicon, or metal oxide. Although not limited thereto, it may be preferably formed of polymer or silicon.

Since the surface energy of the sliding dielectric film 220 is significantly lower than the surface energy of the nanoparticle 230, the surface migration of adatoms 232 incident on the substrate 210 is activated during vacuum deposition. The adatoms 232 are coalesced to form nuclei and the nanoparticle 230, and the adatoms 232 are continuously introduced into the formed nanoparticle 230 to increase the size of the spaced-apart nanoparticles 230.

If the difference between the surface energy of the sliding dielectric film 220 and the surface energy of the nanoparticle 230 is less than 1000 mJ/m$^2$, the surface migration of the adatoms 232 on the substrate 210 may not be activated, resulting in forming a thin film rather than growing nanoparticles 230 being spaced-apart. The difference between the surface energy of the sliding dielectric film 220 and the surface energy of the nanoparticle 230 may be preferably less than or equal to 3000 mJ/m$^2$. However, it is not limited thereto.

The surface energy of the sliding dielectric film may be equal to or less than 100 mJ/m$^2$. However, it is not limited thereto. When the surface energy of the sliding dielectric film exceeds 100 mJ/m$^2$, the surface migration of the adatoms 232 to be deposited on the substrate 210 may be deteriorated. The surface energy of the sliding dielectric film may be preferably equal to or higher than 10 mJ/m$^2$ for forming the nanoparticles 230. However, it is not limited thereto.

The sliding dielectric film may be formed of at least one material selected from alkanethiol, alkyldisulfide, fluorocarbon thiol, fluorocarbon silane, chlorocarbon silane, fluorocarbon carboxylic acid, fluorocarbon amine, fluorocarbon polymer and a derivative thereof.

A water contact angle of the substrate 210 on which the sliding dielectric film is formed may be 90° or more. However, it is not limited thereto. Particle size and density of the nanoparticle 230 may be increased according to the above-described configuration.

A thickness of the sliding dielectric film may be in a range of 0.5 nm to 100 nm. However, it is not limited thereto.

When the thickness of the sliding dielectric film is less than 0.5 nm, the plasmonic effect may be lowered due to quantum tunneling effect.

Figure 4A:
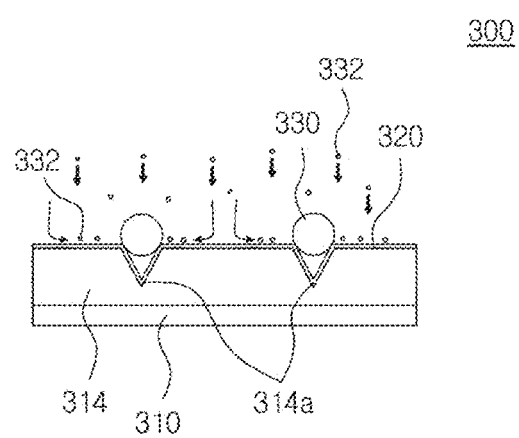
FIGS. 4A, 4B, and 4C illustrate a substrate on which multi-layered metal nanostructures are formed according to an embodiment of this disclosure.
Figure 4B:
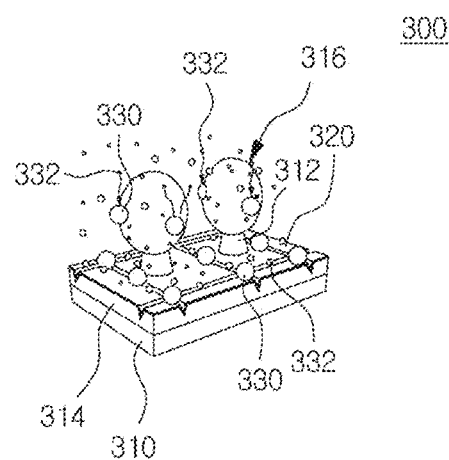
Figure 4C:
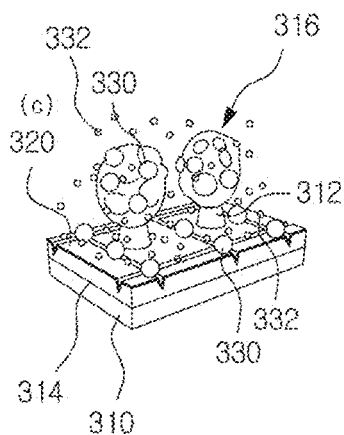

FIGS. 4A, 4B, and 4C are diagrams illustrating mechanism of metal nucleation and formation of nanoparticles based on activation of surface migration of the metal adatoms incident on the surface of a sliding dielectric film with a low surface energy according to an embodiment of this disclosure FIG. 4A is a diagram illustrating metal nucleation and formation of nanoparticles on a substrate 310, a metal-containing thin film 314, and a sliding dielectric film 320 with a low surface energy.

Referring to FIG. 4A, when a heterogeneous metal-containing thin film 314 is formed on a flat substrate 310, a grain boundary is formed between metal grains or crystallites as metal grains or crystallites grow. The region where the grain boundary is formed may form a concave groove 314a.

When the metal atoms 332 reach the surface of the sliding dielectric film 320 having a low surface energy including the grain boundaries, the surface migration of the metal atoms 332 becomes active on the sliding dielectric film 320. The metal atoms 332 migrating on the surface ultimately remain in the concave grooves 314a of the grain boundaries and nuclei are thus formed and eventually grown into a metal nanoparticle 330 because the metal atoms 332 are continuously introduced to the groove during the vacuum deposition.

FIG. 4B illustrates growth of the metal nanoparticle 330 on the three dimensional substrate 300 comprising the substrate 310, the nanostructures 312 formed on the substrate 310, the metal-containing thin film 314, and the sliding dielectric film 320 having a low surface energy.

The metal-containing thin film 314 is formed on the substrate 310 and on a protrusion-typed nanostructure 312.

It is assumed that a three-dimensional metal-containing nanostructure 316 is formed in the shape of a long ellipsoid, and the surface of the ellipsoid is smooth. Since the metal-containing nanostructure 316, which is in the shape of a long ellipsoid, has a large curvature at the top part and a small curvature at the side part, it causes surface migration of the metal atoms 332 reaching the top part of the metal-containing nanostructure 316 toward the side part of the metal-containing nanostructure 316. Accordingly, in the smooth long ellipsoid, the metal nanoparticles 330 are concentrated and formed on the side part of the metal-containing nanostructure 316 having a smaller curvature than the top part having a large curvature.

FIG. 4C illustrates growth of the metal nanoparticle 330 through vacuum deposition on the metal-containing nanostructure 316 of the three-dimensional substrate 300 comprising the substrate 310, the nanostructures 312 formed on the substrate 310, the metal-containing thin film 314, and the sliding dielectric film 320 having a low surface energy in which surface roughness of the metal-containing nanostructure 316 is increased by forming a number of surface bumps.

In this case, since the surface migration of the metal atoms 332 reaching the top part of the metal-containing nanostructure 316, which is in the shape of a long ellipsoid, is restricted due to a large number of surface bumps, the metal particles grow between the surface bumps formed on the top part. Referring to FIGS. 4B and 4C, when a surface roughness of the metal-containing nanostructure 316 formed at the bottom part is controlled, it allows controlling a position of nucleation and surface density of the metal nanoparticle to be formed at the top part.

Figure 5:
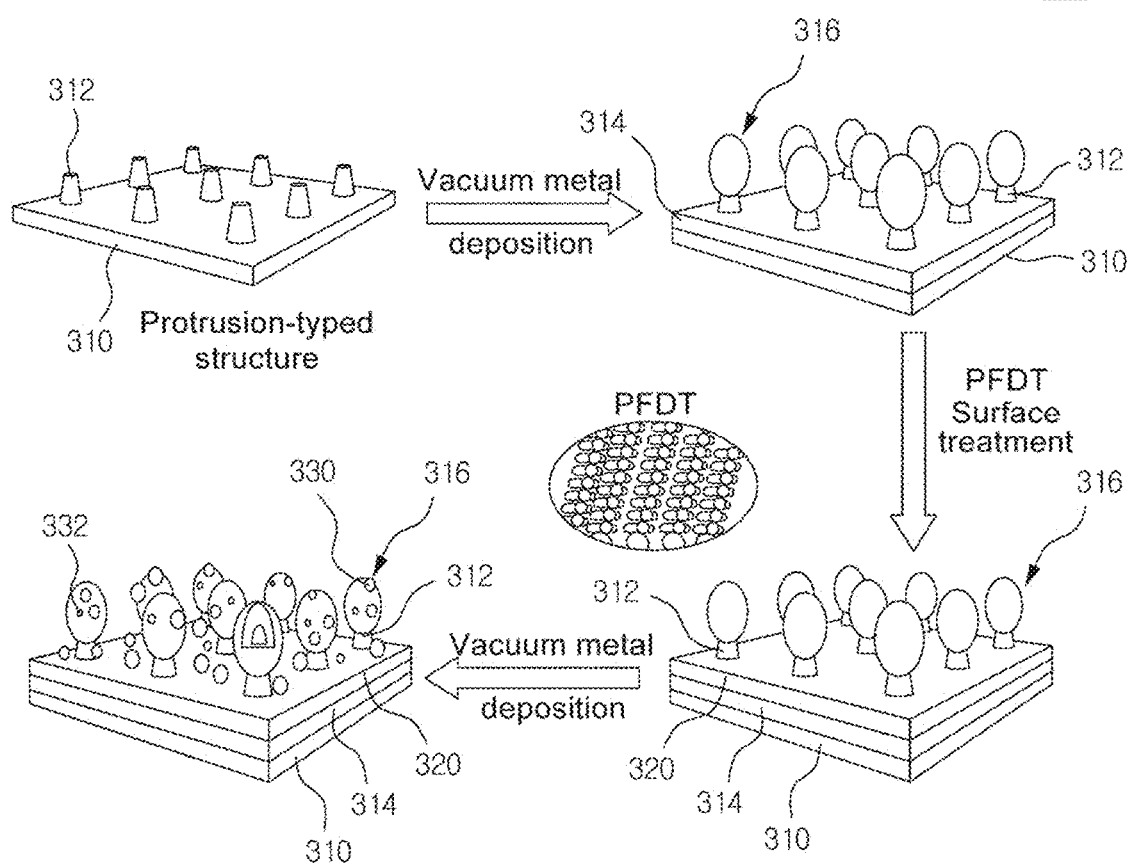
FIG. 5 illustrates example processes used in a method for manufacturing a substrate on which multi-layered metal nanostructures are formed.

FIG. 5 is a schematic view illustrating example processes used in a method of manufacturing a substrate on which multi-layered metal nanostructures are formed.

The protrusion-typed nanostructure 312 may be formed by processing the substrate 310 and may be the same material as the substrate 310. In an embodiment of the disclosure, polyethylene terephthalate (PET) is used as a polymer substrate.

The protrusion-typed nanostructure 312 may be formed by one chosen from plasma etching, soft lithography, nano-imprint lithography, photolithography, and holographic lithography. However, it is not limited thereto.

When the plasma processing is used to process the protrusion-typed nanostructure 312, one or more gases selected from argon, oxygen, hydrogen, helium, nitrogen, fluorine, and chlorine gas may be used.

The metal-containing thin film 314 is formed on the surface of the substrate 310 and on the protrusion-typed nanostructure 312.

The metal-containing thin film 314 is formed by vacuum deposition of a Raman active material. According to an embodiment of the disclosure, the Raman active material is initially deposited uniformly on the surface of the substrate 310 and the protrusion-typed nanostructure 312. However, as the deposition progresses, it is concentratedly deposited on the protrusion-typed nanostructure 312. Therefore, the metal-containing nanostructure 316 may have a curvature higher at the top part than that at the bottom part. As shown in FIG. 5, the metal-containing nanostructure 316 is formed into a three-dimensional long ellipsoidal shape.

In addition, the metal-containing thin film 314 is concentratedly deposited on the metal-containing nanostructure 316 as a shadow effect due to the particles already deposited on the metal-containing nanostructure 316 as the deposition progresses.

The vacuum deposition may be performed by any one of sputtering, evaporation, chemical vapor deposition, and atomic layer deposition. However, it is not limited thereto.

The Raman active material may be any one of Al, Au, Ag, Cu, Pt, Pd, and an alloy thereof. However, it is not limited thereto.

The metal-containing thin film 314 may be formed by vacuum depositing Au, Ag, or alloy thereof to a thickness of 10 nm or more. According to an embodiment of the disclosure, the surface migration of the metal atoms 332 on the substrate 310 may be activated to increase the size of the nanoparticle 330. Accordingly, even when a metal deposition thickness is increased to 20 nm, 40 nm, 60 nm, 80 nm, or 100 nm, an average particle size of the nanoparticle 330 on the metal-containing nanostructure 316 increases, but formation of a continuous thin film is prevented.

A self-assembled monolayer (SAM) may be used as the sliding dielectric film 320 with a low surface energy. The self-assembled monolayer may be conformally coated on the metal-containing thin film 314 and may form to a thickness of 0.5 nm to 5 nm depending on the chain length.

The sliding dielectric film 320 having a low surface energy may be formed using any one of vapor deposition and solution process, or other processes for forming the sliding dielectric film 320 may be used.

The vapor deposition may be any one of vapor phase deposition, chemical vapor deposition, sputtering, and thermal evaporation. However, it is not limited thereto.

The solution process may be any one of spin coating, dip coating, and dropping. However, it is not limited thereto.

In one embodiment of the disclosure, the self-assembled monolayer may be formed only on an Au surface by selective chemical bonding between a thiol functional group of a fluorinated compound of 1H, 1H, 2H, 2H-perfluorodecanethiol (PFDT) having a low surface energy and an Au atom.

Examples of low surface energy materials include alkanethiol, alkyldisulfide, fluorocarbon thiol, fluorocarbon silane, chlorocarbon silane, fluorocarbon carboxylic acid, fluorocarbon amine, fluorocarbon polymer and a derivative thereof. However, it is not limited thereto.

A thickness of the sliding dielectric film 320 with a low surface energy may be from 0.5 nm to 100 nm, preferably from 0.5 nm to 50 nm, more preferably from 0.5 nm to 10 nm. The metal-containing thin film 314 and the metal-containing nanoparticle 330 are spaced-apart by a thickness of the sliding dielectric film 320 because the metal-containing nanoparticle 330 is formed on the sliding dielectric film 320. Therefore, if the thickness of the sliding dielectric film 320 is less than 0.5 nm or more than 100 nm, it is impossible to induce plasmonic coupling between both metals.

The metal-containing nanoparticle 330 may be formed by vacuum depositing a Raman active material.

The vacuum deposition may be performed by any one of sputtering, evaporation, chemical vapor deposition, and atomic layer deposition. However, it is not limited thereto.

The Raman active material may be any one of Al, Ag, Au, Cu, Pt, Pd and an alloy thereof. It may be suitable for activating the surface migration of the metal atoms 332 on the sliding dielectric film 320 when the material is composed of an element with a large surface energy.

Size of and distance between the metal-containing nanoparticles 330 may be controlled by adjusting deposition thickness and deposition rate of the metal-containing nanoparticle 330.

According to an embodiment, the substrate may further comprise a second metal-containing thin film between the substrate 312 and the first metal-containing thin film 314, wherein the second metal-containing thin film has a lower surface energy than the first metal-containing thin film does.

The second metal-containing thin film may be formed of one of Ag, Cu, Pt, Pd, Ti, and an alloy thereof.

The nanoparticle may have an average particle size of at least 40 nm. Due to increase of activation of the surface migration of the metal atoms 332 on the substrate 310, particularly the surface migration of the metal atoms 332 to the side parts of the metal-containing nanostructures 316, the average particle size of the nanoparticle 330 is increased, which may be suitable for inducing the plasmonic coupling effect. When the nanoparticles 330 are present on the side parts of the metal-containing nanostructure 316, the metal nanoparticles 330 may induce the plasmonic coupling stronger than that located on the top part of the metal-containing nanostructure 316 since a polarization direction of an incident laser light upon the SERS measurement aligns an assembly direction of the metal nanoparticle 330 and the metal-containing nanostructure 316.

Hereinafter, the disclosure will be described in more detail with the following examples.

Example 1

1. Metal (Ti and Au) Vacuum Deposition
Ti and Au were thermally evaporated on a flat silicon substrate under the following conditions.
Thermal evaporation process
Vacuum level for deposition: $5.0 \times 10^{-6}$ torr
Ti deposition rate: 0.5 Å/s
Ti deposition thickness: 5 nm
Au deposition rate: 2.0 Å/s
Au deposition thickness: 100 nm
Ti was deposited to increase the adhesion between Au and the Si substrate.

2. Formation of a Self-Assembled Monolayer
In order to form a self-assembled monolayer on the Au film formed in the metal (Ti and Au) vacuum deposition, vapor phase deposition was performed under the following conditions.
Deposition material: 1H, 1H, 2H, 2H-perfluorodecanethiol (PFDT)
Vapor phase deposition conditions
10 μl of 97% PFDT was dropped onto a glass petri dish;
A 2×2 cm² Au substrate was attached to a glass petri dish lid and sealed, and the PFDT vapor was surface treated on the Au substrate for 2 hours.

Figure 6A:
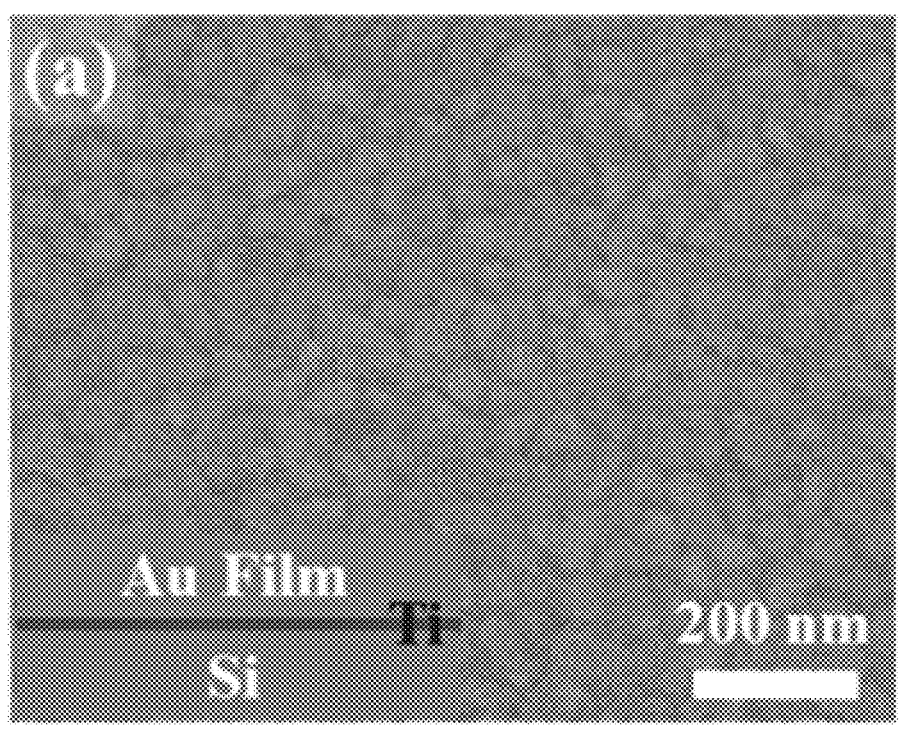
FIGS. 6A, 6B, 6C, 6D, 6E, and 6F illustrate scanning electron microscopy (SEM) and atomic force microscopy (AFM) images illustrating a substrate on which two-dimensional multi-layered metal nanostructures are formed according to an embodiment of this disclosure.
Figure 6B:
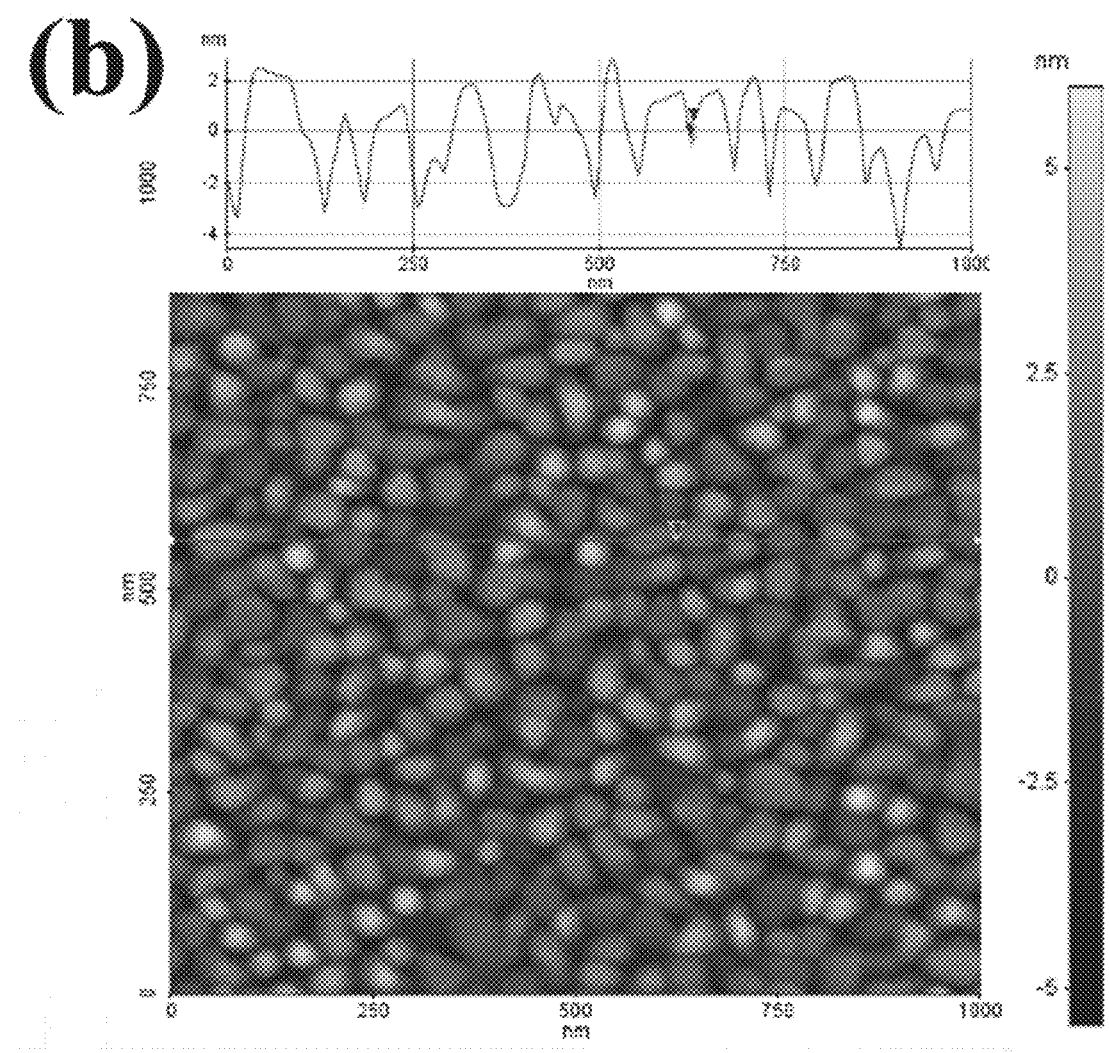
Figure 6C:
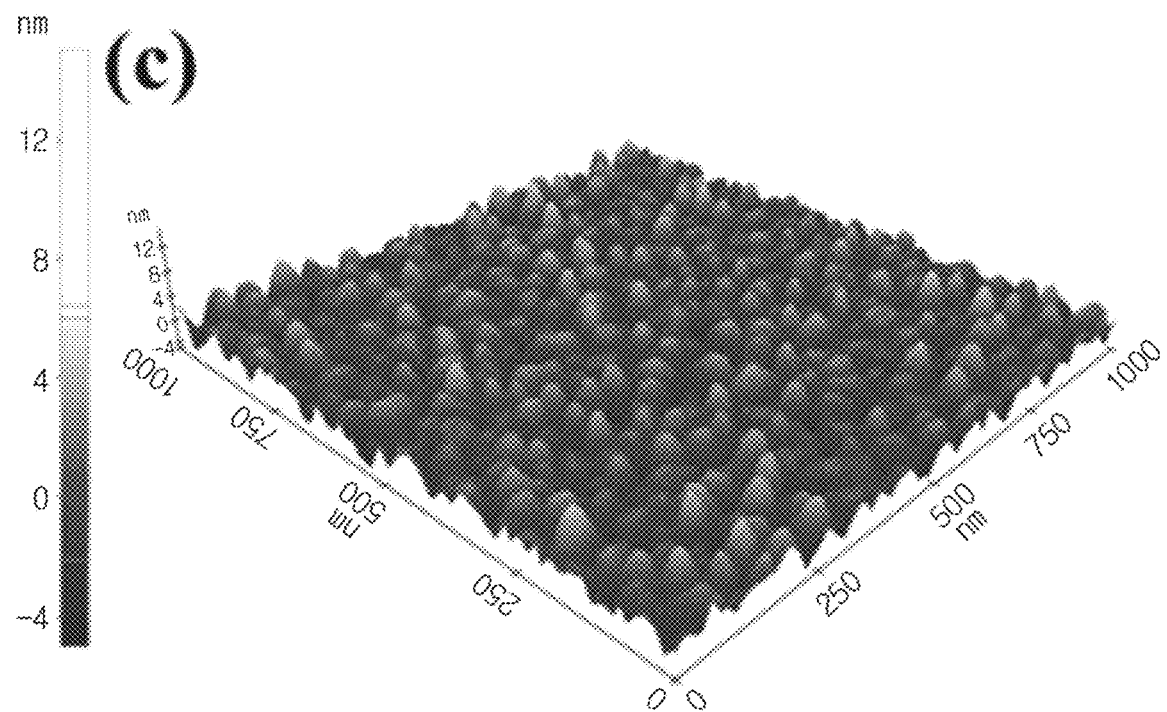

3. Metal (Au) Nanoparticle Vacuum Deposition
Au was thermally evaporated on the surface of the substrate where the PFDT self-assembled monolayer was formed under the following conditions.
Thermal evaporation process
Vacuum level for deposition: $9.8 \times 10^{-6}$ torr
Au deposition rate: 0.3 Å/s
Au deposition thickness: 10 nm, 20 nm FIGS. 6A, 6B, 6C, 6D, 6E, and 6F are SEM and AFM images illustrating a substrate on which a two-dimensional multi-layer metal nanostructure is formed according to an embodiment of the disclosure. FIGS. 6A, 6B, and 6C illustrate SEM and AFM images when 5 nm Ti and 100 nm Au were continuously deposited on a flat Si substrate by thermal evaporation. It is noted in the SEM image that many grain boundaries are formed on the Au surface even though the vacuum deposition is performed on the flat Si substrate. It is further noted in the AFM image that the regions where the grain boundaries are formed are concaved compared to the other regions where grain boundaries are not formed.

Figure 6D:
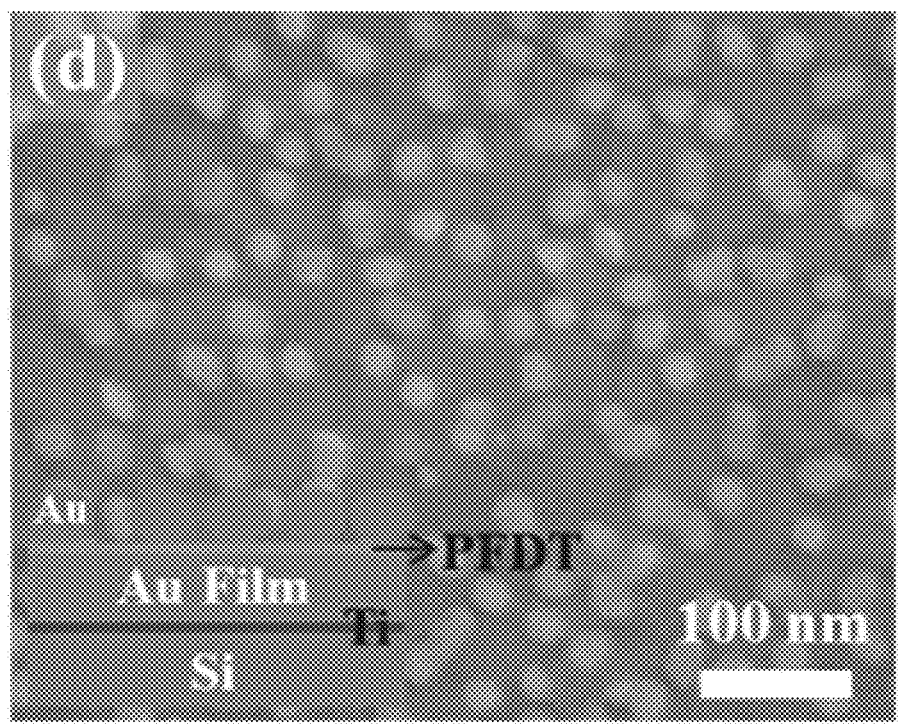
Figure 6E:
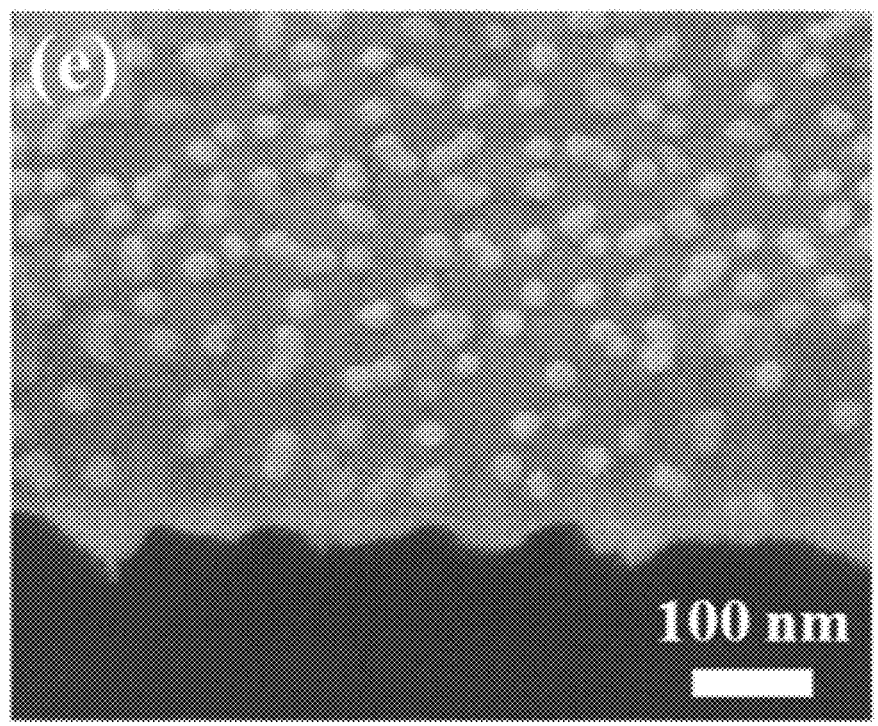
Figure 6F:
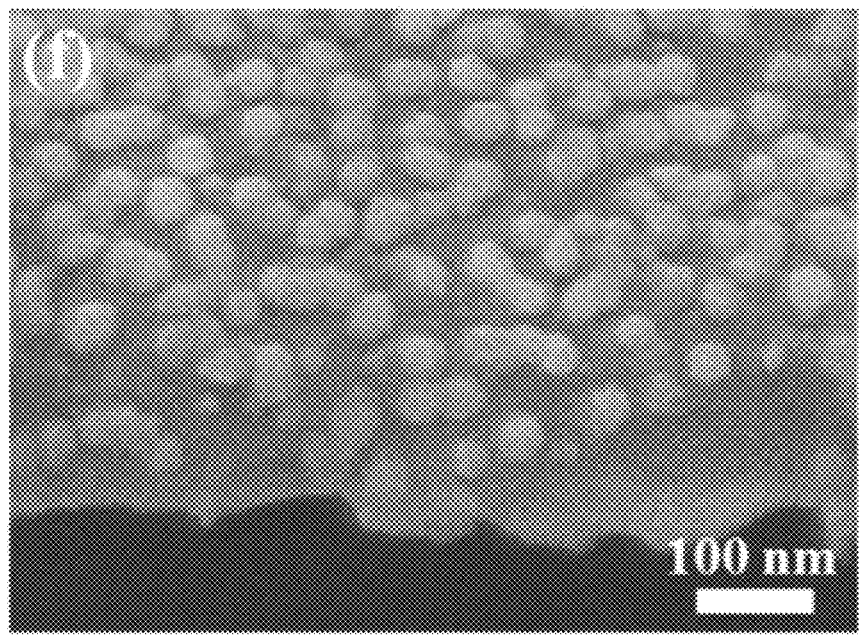

FIGS. 6D and 6E are SEM images illustrating a substrate on which a self-assembled monolayer is formed on the surface of Au including grain boundaries by vapor phase deposition of PFDT and then thermally evaporated with Au nanoparticle to 10 nm. It is noted that Au nanoparticles are selectively formed only in the region where grain boundaries are formed and the Au nanoparticle is coalesced with neighboring Au nanoparticles each other as the size of Au nanoparticle increases.

It is also observed that triangular-shaped Au nanoparticles are formed at the center point of the Y-shaped grain boundary. It can be speculated that Au atoms with a high surface energy (1400 mJ/m²) reaching the surface of PFDT with a very low surface energy (14.8 mJ/m²) migrate on the smooth and flat surface of PFDT and nuclei are formed and grown selectively at the recessed grain boundaries. Generally, the self-assembled monolayer is well formed on the flat Au surface, but it is known that defects occur in the formation of the monolayer at the grain boundary regions.

It is confirmed that Au nuclei are formed selectively at these defect positions and Au nanoparticles are formed due to the continuous inflow of Au adatoms. When the deposition thickness of Au is increased to 20 nm (FIG. 6F), it is observed that the Au nanoparticles formed in the grain boundaries continuously grow.

Figure 7A:
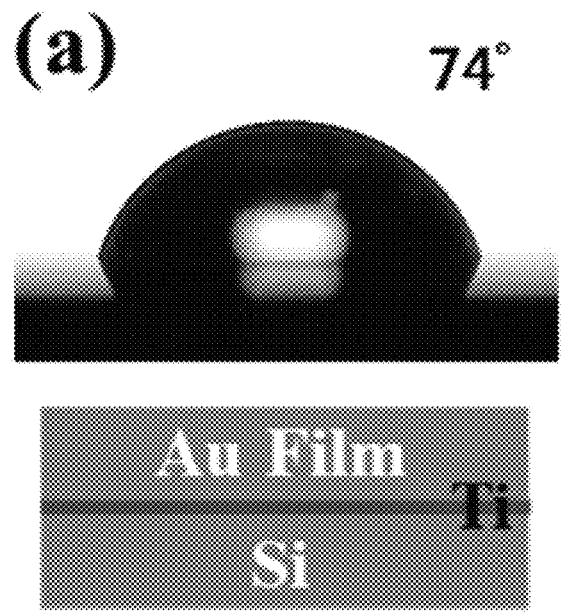
FIGS. 7A and 7B are images illustrating water contact angles of a two-dimensional substrate formed according to an embodiment of this disclosure.
Figure 7B:
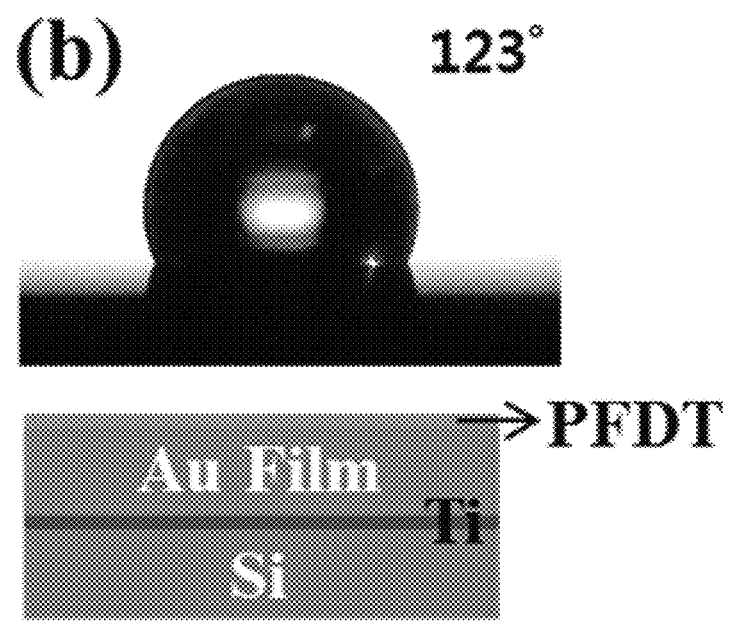

FIGS. 7A and 7B are images illustrating water contact angles of a two-dimensional substrate formed according to an embodiment of this disclosure. FIG. 7A is an image illustrating a water contact angle of the substrate having surface characteristics shown in FIG. 6A, wherein the water contact angle on an Au film is 74°. FIG. 7B is an image illustrating a water contact angle of the substrate after the self-assembled monolayer is formed with PFDT, wherein the water contact angle greatly increases to 123°. That is, it can be confirmed that the wettability is changed from hydrophilic to hydrophobic by the formation of the self-assembled monolayer having a low surface energy.

Example 2

1. Preparation of PET Nanorods

A PET polymer substrate was subjected to Ar plasma treatment, and PET nanorods were prepared under the following conditions.

Initial vacuum level: $6.8 \times 10^{-3}$ torr
Plasma processing of the polymer substrate
Vacuum level: $8.0 \times 10^{-2}$ torr
Operation gas: Ar 5 sccm
RF plasma power: 100 W
Processing time: 2 min 2. Metal Vacuum Deposition Au was vacuum deposited on the polymer nanorods prepared above by sputtering and thermal evaporation under the following conditions.

Figure 8A:
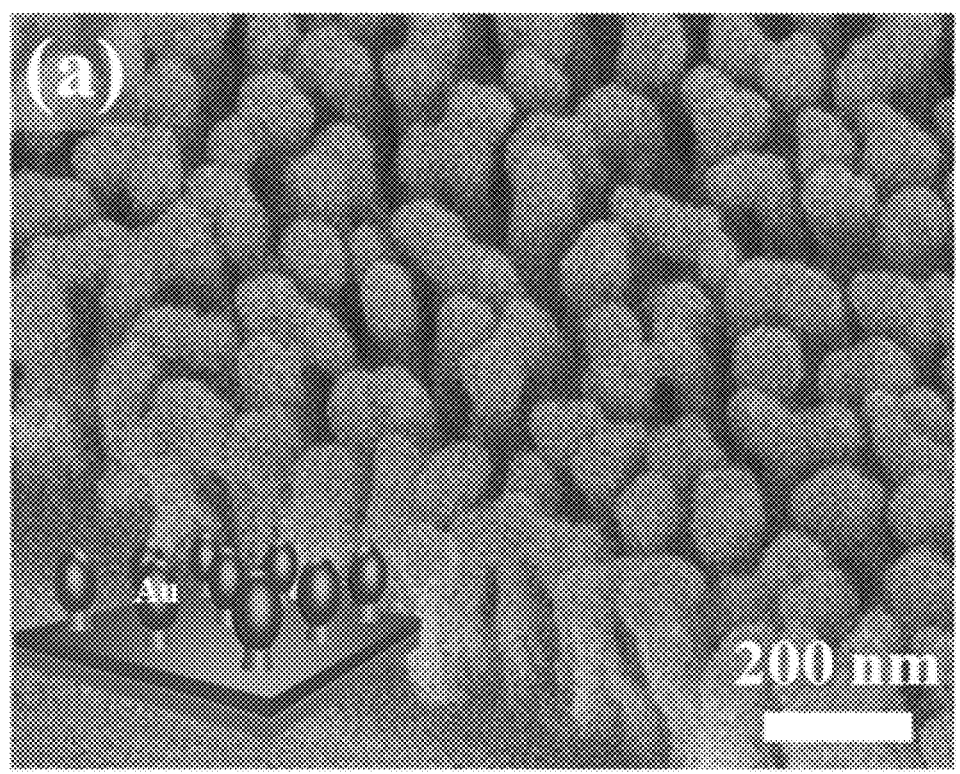
FIGS. 8A, 8B, 8C, and 8D are SEM and AFM images illustrating a substrate on which lower Au nanorods are formed by a metal deposition according to an embodiment of this disclosure.
Figure 8B:
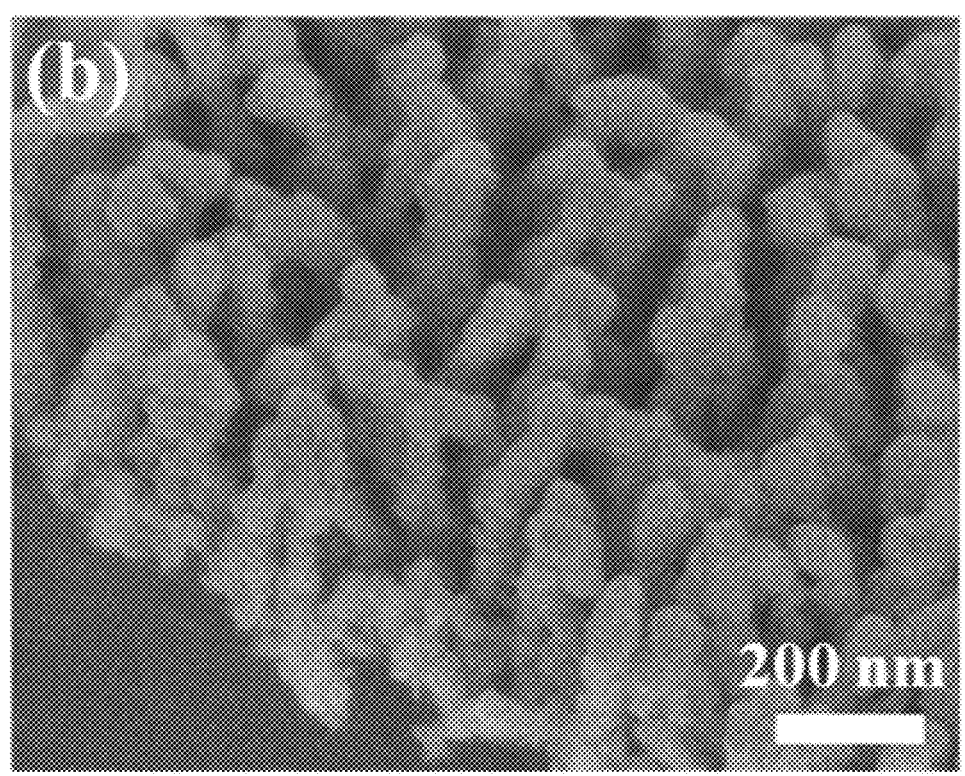
Figure 8C:
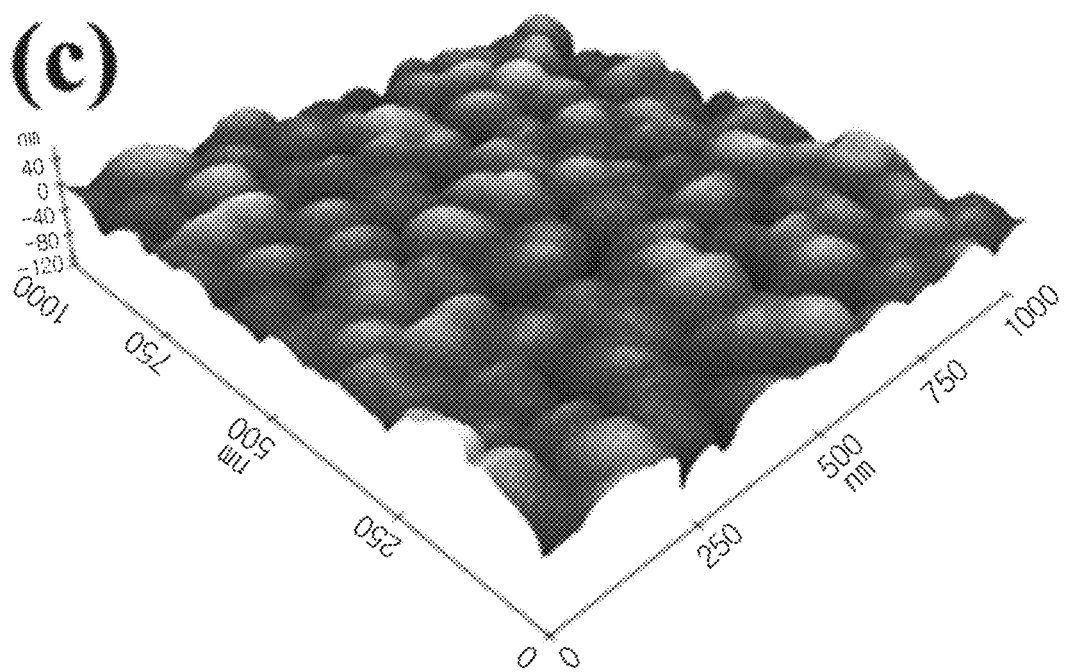
Figure 8D:
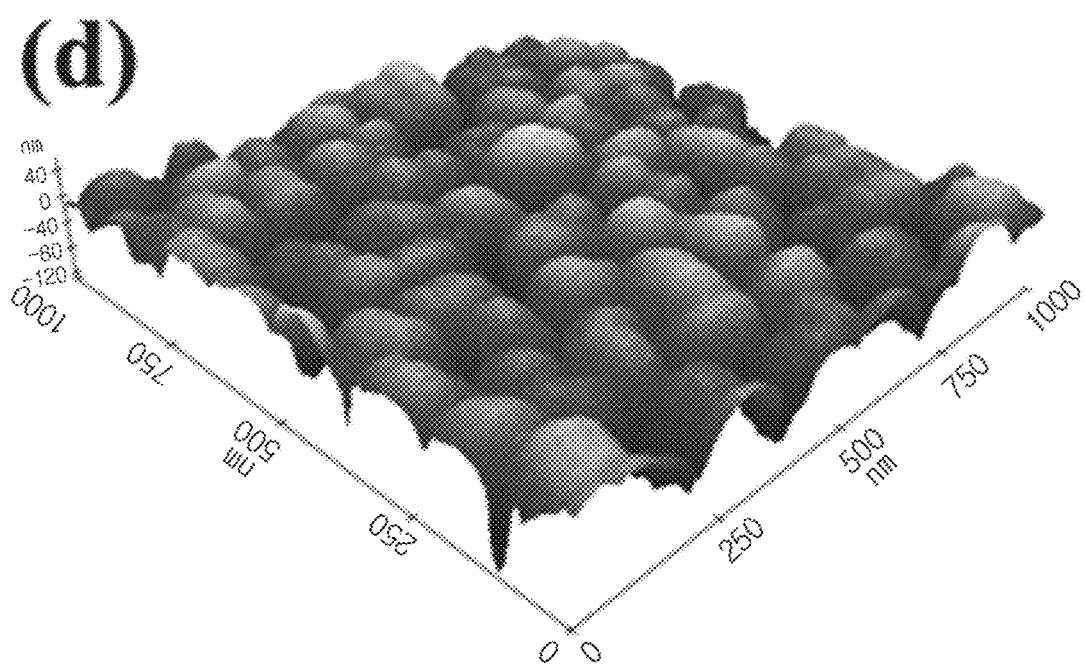

Au sputtering process
Vacuum level: $7.0 \times 10^{-2}$ torr
Operation gas: Ar 20 sccm
RF plasma power: 100 W
Au deposition rate: 2.0 Å/s
Au deposition thickness: 100 nm
Au thermal evaporation process
Vacuum level for deposition: $9.8 \times 10^{-6}$ torr
Au deposition rate: 2.0 Å/s
Au deposition thickness: 100 nm FIGS. 8A, 8B, 8C, and 8D are SEM and AFM images illustrating a substrate on which a metal-containing thin film is formed on the PET nanorods according to an embodiment of this disclosure. FIGS. 8A and 8C are SEM and AFM images, respectively, illustrating the substrate on which the nanorods are formed on the PET substrate by the Ar plasma etching and then 100 nm of Au are deposited by the sputtering process. FIGS. 8B and 8D are SEM and AFM images, respectively, illustrating the substrate on which the nanorods are formed on the PET substrate by the Ar plasma etching and then 100 nm of Au are deposited by the thermal evaporation process.

It can be firmly noted that the surface morphology is different depending on the vacuum deposition method. The surface roughness of the Au nanorod formed by the sputtering method is 11.30 nm which is significantly smaller than that of the Au nanorod formed by thermal evaporation method which is 20.03 nm. In other words, the Au surface can be smoothly formed by the sputtering method, and the surface roughness can be increased by the thermal evaporation method.

Figure 9A:
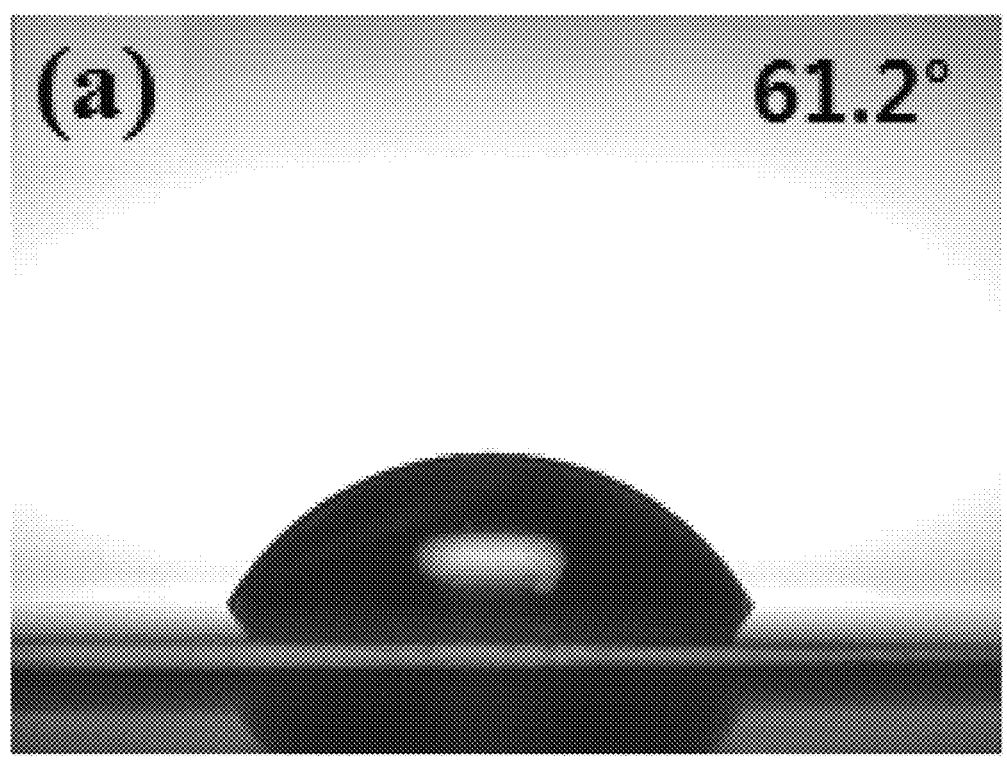
FIGS. 9A and 9B are images illustrating water contact angles of a substrate on which lower Au nanorods are formed by forming a sliding dielectric film with a low surface energy according to an embodiment of this disclosure.
Figure 9B:
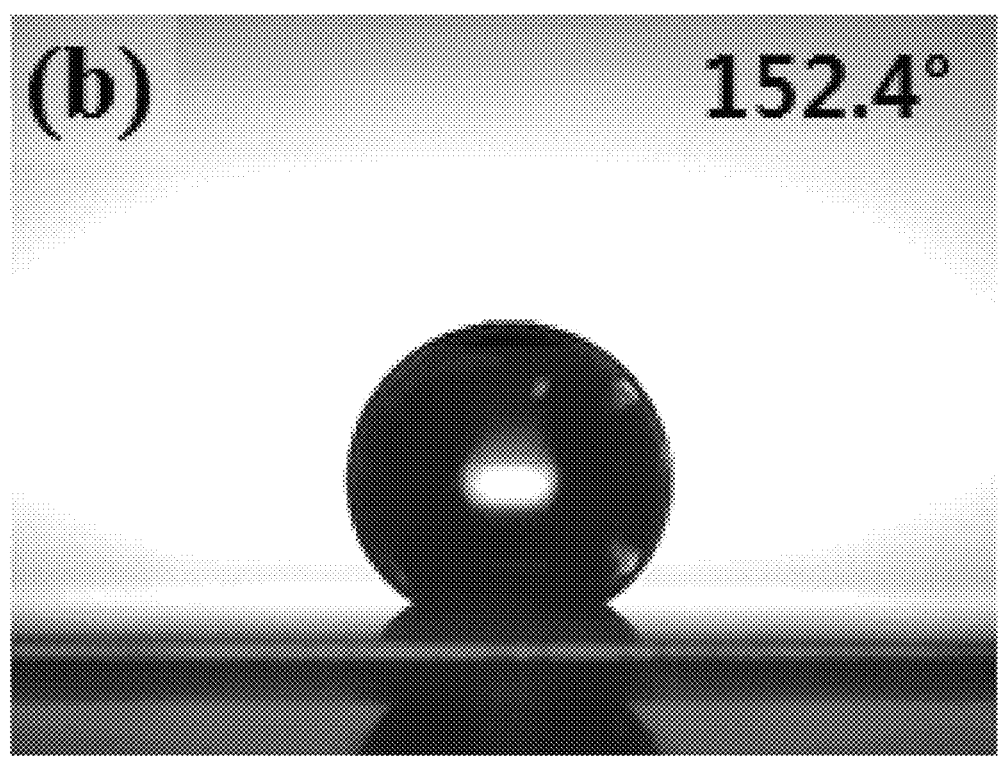

FIGS. 9A and 9B are images illustrating change in a water contact angle as a sliding dielectric film having a low surface energy is formed on the substrate on which the Au nanorods are formed by the thermal evaporation method according to an embodiment of the disclosure. FIG. 9A is an image illustrating a water contact angle of the substrate having surface characteristics shown in FIG. 8B, wherein the water contact angle on the Au nanorod is 61.2°. FIG. 9B is an image illustrating a water contact angle the substrate after the self-assembled monolayer is formed with PFDT, wherein the water contact angle greatly increases to 152.4°. That is, it can be confirmed that the wettability of the three-dimensional nanorod with water is changed from hydrophilic to super water-repellent by the formation of the self-assembled monolayer having a low surface energy.

Example 3

1. Preparation of PET Nanorods

A PET polymer substrate was subjected to Ar plasma treatment, and PET nanorods were prepared under the following conditions.

Initial vacuum level: $6.8 \times 10^{-3}$ torr
Plasma processing of the polymer substrate
Vacuum level: $8.0 \times 10^{-2}$ torr
Operation gas: Ar 5 sccm
RF plasma power: 100 W
Processing time: 2 min 2. Metal Vacuum Deposition Au was vacuum deposited on the polymer nanorods prepared above by sputtering process under the following conditions.

Au sputtering process
Vacuum level: $7.0 \times 10^{-2}$ torr
Operation gas: Ar 20 sccm
RF Plasma power: 100 W
Au deposition rate: 2.0 Å/s
Au deposition thickness: 100 nm 3. Formation of a Self-Assembled Monolayer A self-assembled monolayer is formed on the PET/Au nanorods prepared the metal vacuum deposition described above under the following conditions.

Deposition material: 1H, 1H, 2H, 2H-Perfluorodecanethiol (PFDT)
Vapor phase deposition conditions
10 µl of 97% PFDT was dropped onto a glass petri dish;
A 2×2 cm² Au substrate was attached to a glass petri dish lid and sealed, and the PFDT vapor was surface treated on the Au substrate for 2 hours.

4. Au Nanoparticle Vacuum Deposition

Au was vacuum deposited on the surface of the substrate on which the PFDT self-assembled monolayer was formed under the following conditions.

Figure 10A:
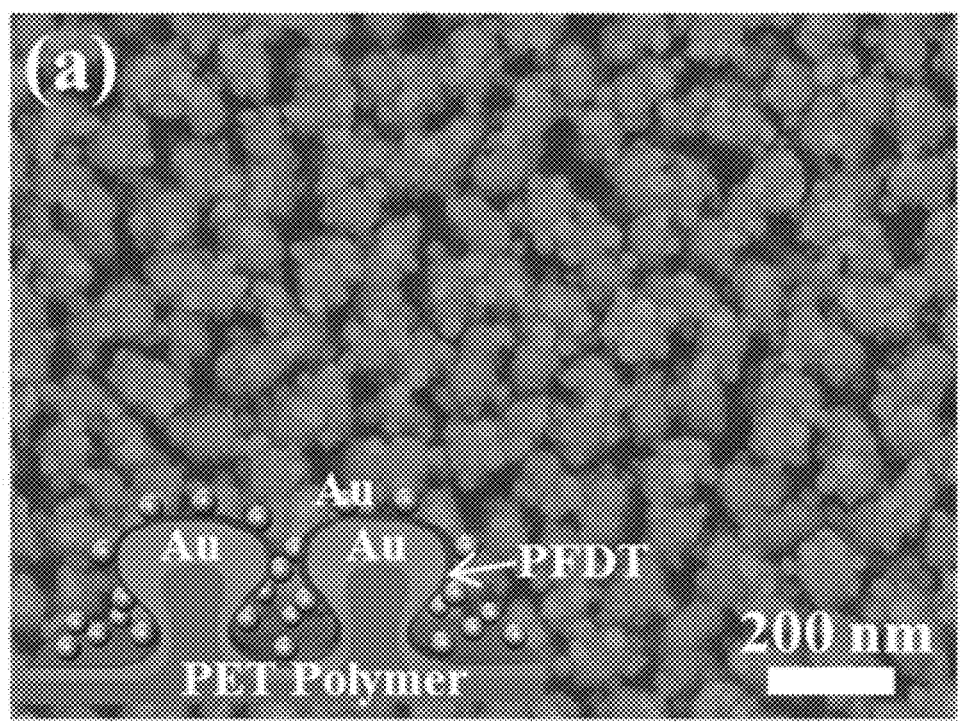
FIGS. 10A, 10B, 10C, 10D, 10E, and 10F are SEM and AFM images illustrating a substrate on which lower Au nanorods having smooth surface and Au nanoparticles vacuum-deposited on a sliding dielectric film with a low surface energy are formed according to an embodiment of this disclosure.
Figure 10B:
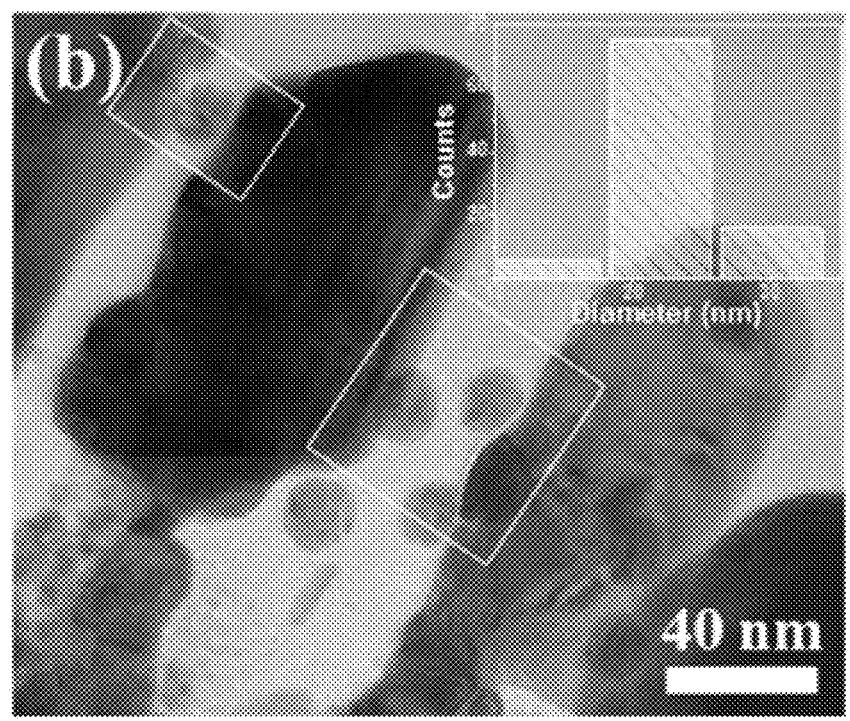
Figure 10C:
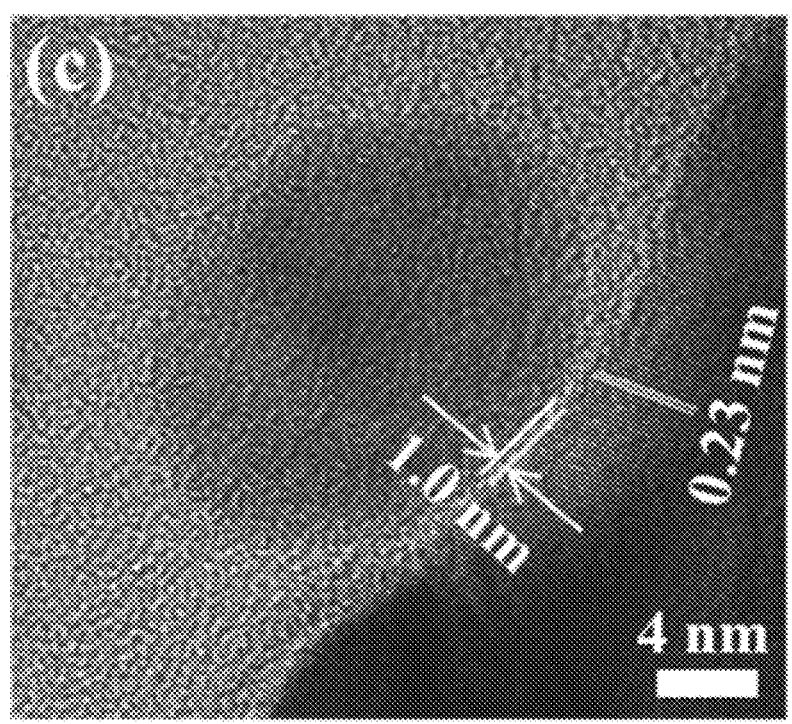
Figure 10D:
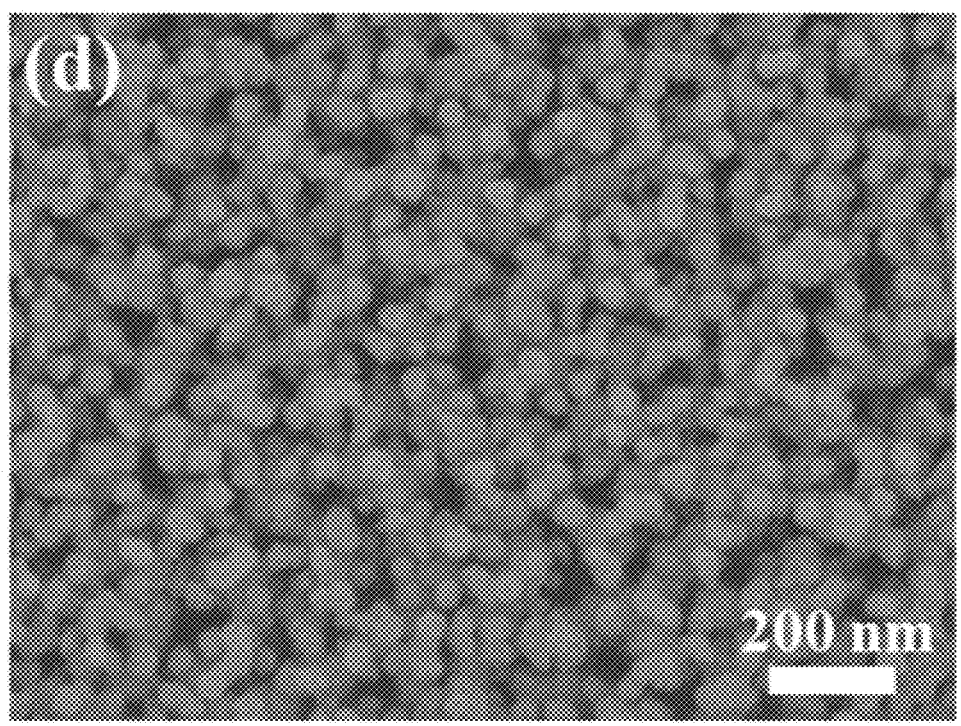
Figure 10E:
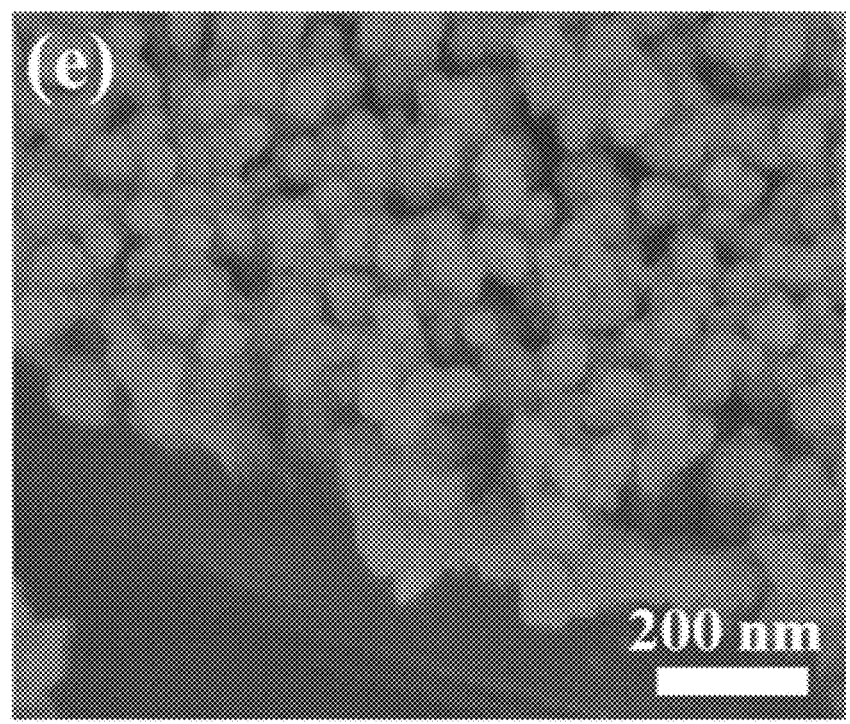
Figure 10F:
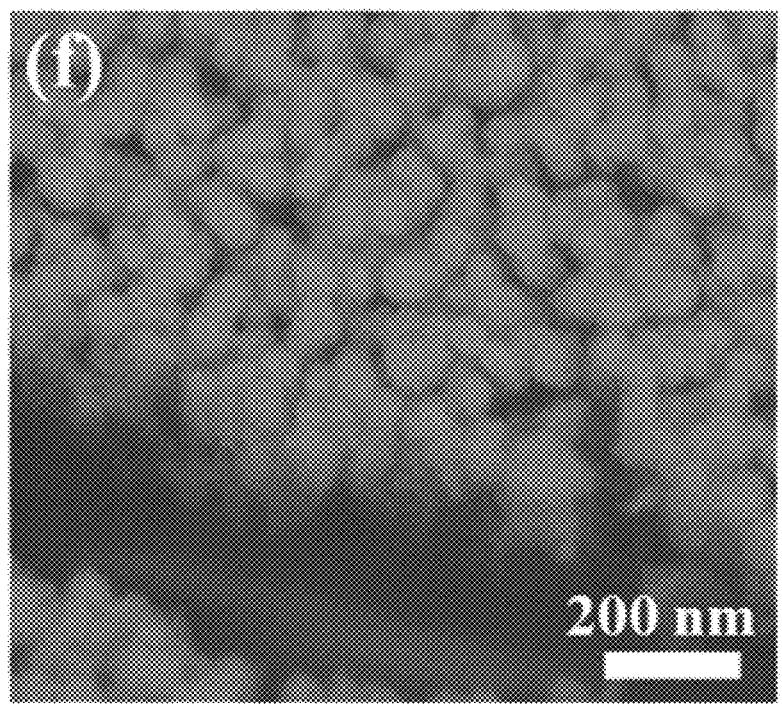

Thermal evaporation process
Vacuum level for deposition: $9.8 \times 10^{-6}$ torr
Au deposition rate: 0.3 Å/s
Au deposition thickness: 20 nm to 100 nm FIGS. 10A, 10B, 10C, 10D, 10E, and 10F are SEM and AFM images illustrating a multi-layered metal nanostructure including the sliding dielectric film according to an embodiment of the disclosure. Here, the PET nanorods are formed by subjecting the plasma treatment on the PET substrate and Au was vacuum deposited by the sputtering method to a thickness of 100 nm. FIGS. 10A, 10B, and 10C are SEM and TEM images illustrating the substrate on which Au was thermal deposited to 20 nm after the PFDT treatment. FIG. 10A is a SEM image illustrating that spherical Au nanoparticles are spaced-apart from each other on the three-dimensional nanorods. FIG. 10B is a TEM image clearly illustrating that the lower Au nanorods are formed in a long ellipsoid and the curvature of the top part is larger than the curvature of the side part. It also illustrates that smooth surface is formed. It can be speculated that if PFDT is conformally coated on the smooth surface with a thickness of 1.0 nm (FIG. 10C), the nuclei of the Au atoms are intensively formed on the side surface having a small curvature while moving on the surface, instead of forming nuclei on the surface having a larger curvature (the square region in FIG. 10B). In addition, an Au nanoparticle is intercalated between neighboring nanostructures in a region where the distance between Au nanorods is small (a rectangular region in FIG. 10B). It is also noted that the size of Au nanoparticles formed on the upper part is very uniform. When the deposition thickness is 20 nm, the average particle size of the formed Au nanoparticles is 22.4 nm±3.7 nm, which can form very conformal spherical Au nanoparticles. As Au deposition thickness is increased to 40 nm (FIG. 10D), 60 nm (FIG. 10E) and 80 nm (FIG. 10F), the initially formed Au nanoparticles gradually grow more and more. It is confirmed that even though the Au deposition thickness is increased to 80 nm, the Au nanoparticles are spaced-apart from each other, instead of forming a continuous thin film and the average particle size of the Au nanoparticles is about 66 nm.

Example 4

1. Preparation of PET Nanorods

The PET polymer substrate was subjected to Ar plasma treatment, and PET nanorods were prepared according to the following conditions.
Initial Vacuum level: $6.8 \times 10^{-3}$ torr
Plasma processing of the polymer substrate
Vacuum level: $8.0 \times 10^{-2}$ torr
Operation gas: Ar 5 sccm
RF plasma power: 100 W
Processing time: 2 min 2. Metal Vacuum Deposition Au was vacuum deposited on the polymer nanorods prepared above under the following conditions.
Au thermal evaporation process
Vacuum level for deposition: $9.8 \times 10^{-6}$ torr
Au deposition rate: 2.0 Å/s
Au deposition thickness: 100 nm 3. Formation of a Self-Assembled Monolayer A self-assembled monolayer is formed on the PET/Au nanorods prepared the metal vacuum deposition described above under the following conditions.
Deposition material: 1H, 1H, 2H, 2H-Perfluorodecanethiol (PFDT)
Vapor phase deposition conditions
10 µl of 97% PFDT was dropped onto a glass petri dish; A $2 \times 2$ cm$^2$ Au substrate was attached to a glass petri dish lid and sealed, and the PFDT vapor was surface treated on the Au substrate for 2 hours.

4. Au Nanoparticle Vacuum Deposition

Figure 11A:
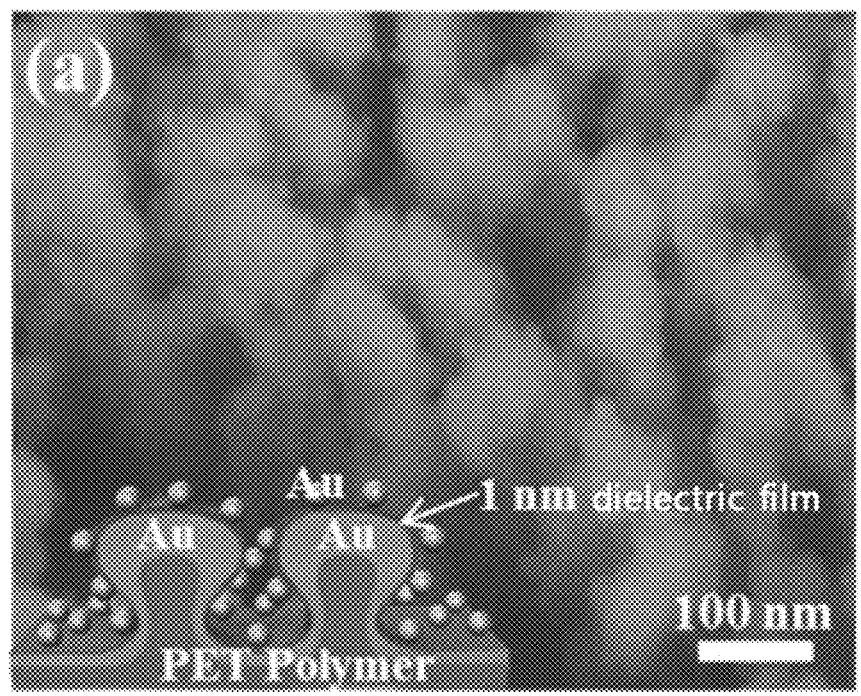
FIGS. 11A, 11B, 11O, 11D, 11E, and 11F are SEM and AFM images illustrating a substrate on which lower Au nanorods having rough surface and Au nanoparticles vacuum-deposited on a sliding dielectric film with a low surface energy are formed according to an embodiment of this disclosure.
Figure 11B:
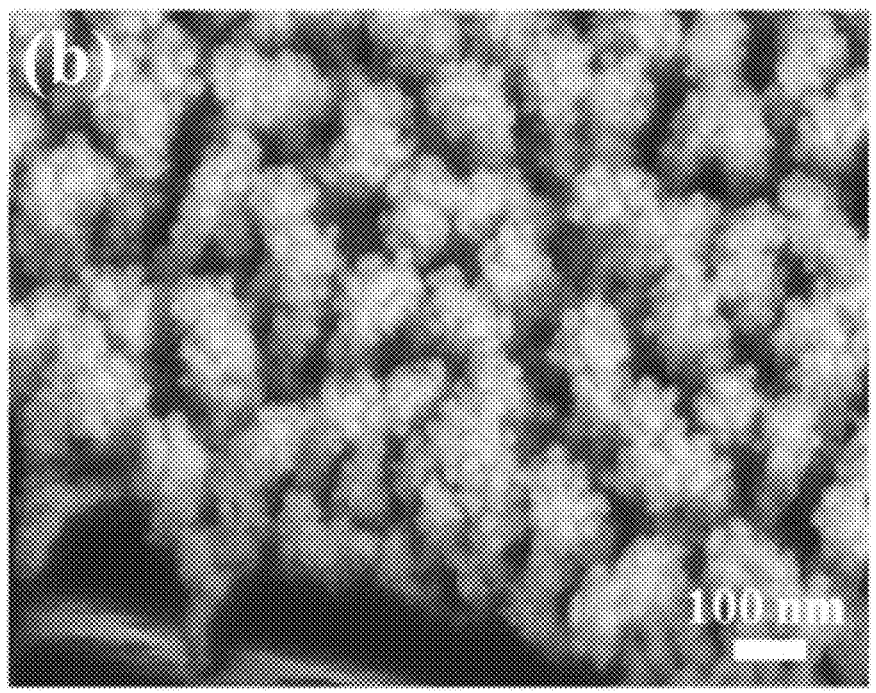
Figure 11C:
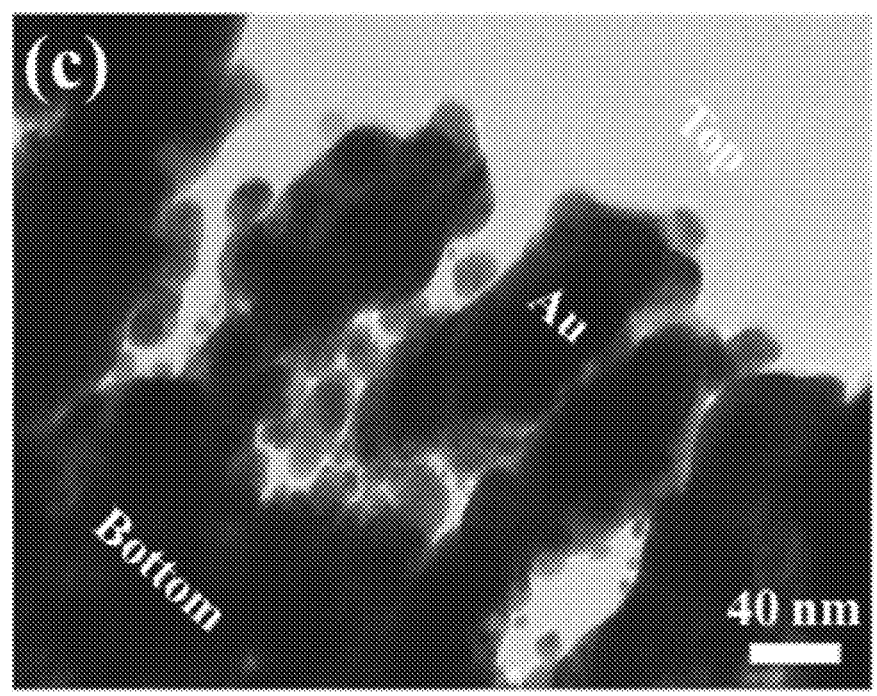
Figure 11D:
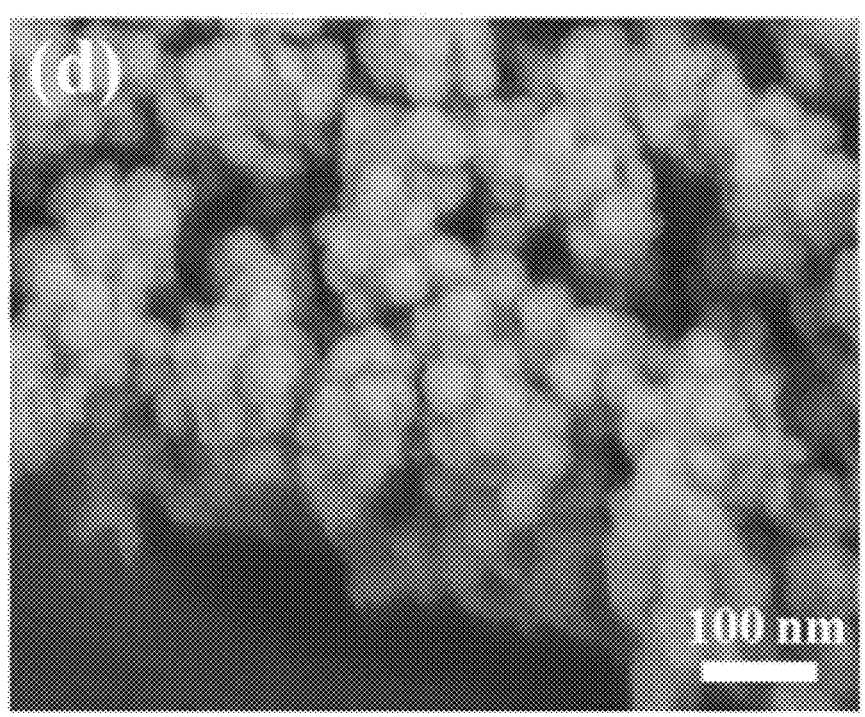
Figure 11E:
Figure 11F:
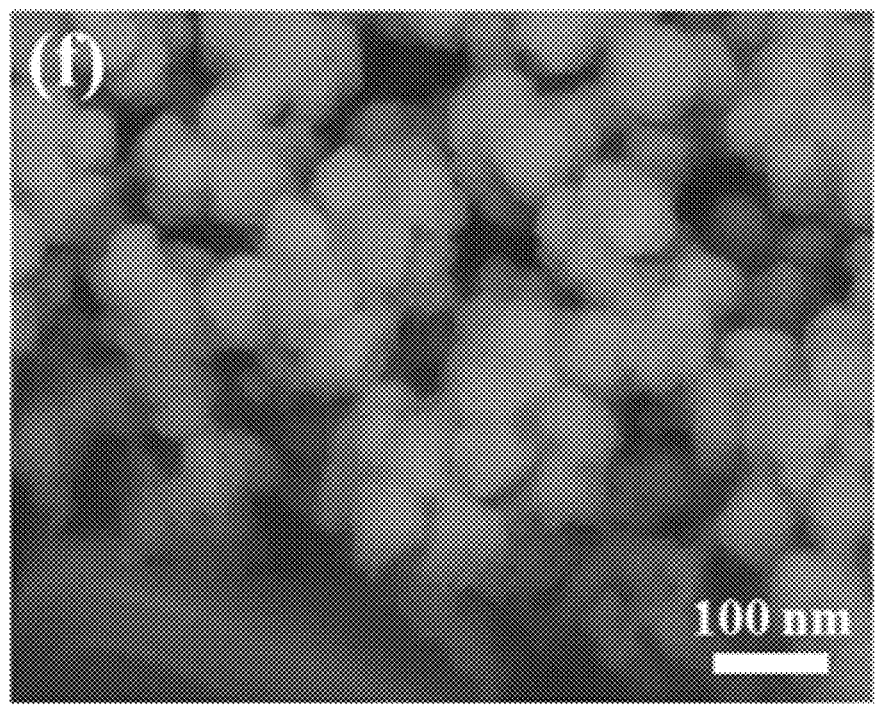

Au was vacuum deposited on the surface of the substrate on which the PFDT self-assembled monolayer was formed under the following conditions.
Thermal evaporation process
Vacuum level for deposition: $9.8 \times 10^{-6}$ torr
Au deposition rate: 0.3 Å/s
Au deposition thickness: 20 nm to 100 nm FIGS. 11A, 11B, 11C, 11D, 11E, and 11F are SEM and AFM images illustrating a multi-layered metal nanostructure according to an embodiment of the disclosure. Here, the nanorods are formed by subjecting the plasma treatment on the PET substrate and Au was vacuum deposited by the thermal evaporation method to a thickness of 100 nm. And then PFDT SAM treatment was performed and upper Au nanoparticles are formed by depositing Au till the Au deposition thickness becomes 10 nm (FIG. 11A), 20 nm (FIGS. 11B and 11O), 60 nm (FIG. 11D), 80 nm (FIG. 11E), and 100 nm (FIG. 11F).

As shown in FIGS. 8B and 8D, if the Au nanostructures are formed by the thermal evaporation method, the surface roughness is increased by a plurality of surface bumps. Surface migration of Au atoms depositing on the upper part is restricted with increased surface roughness, resulting in forming Au nanoparticles on the entire surface of the lower structure and increasing of the density, compared to the lower structure with smooth surface at the same deposition thickness (compare FIG. 11B with FIG. 10A). FIG. 11C is a TEM illustrating that the substrate having the Au nanorods formed thereon by the thermal evaporation method has a high surface roughness and a large number of the upper Au nanoparticles are entirely distributed. The average particle size of the spaced-apart Au nanoparticles are gradually increased to 40.5 nm, 46.5 nm, and 55 nm when Au are deposited to the upper Au deposition thickness of 60 nm, 80 nm, and 100 nm, respectively.

Figure 12:
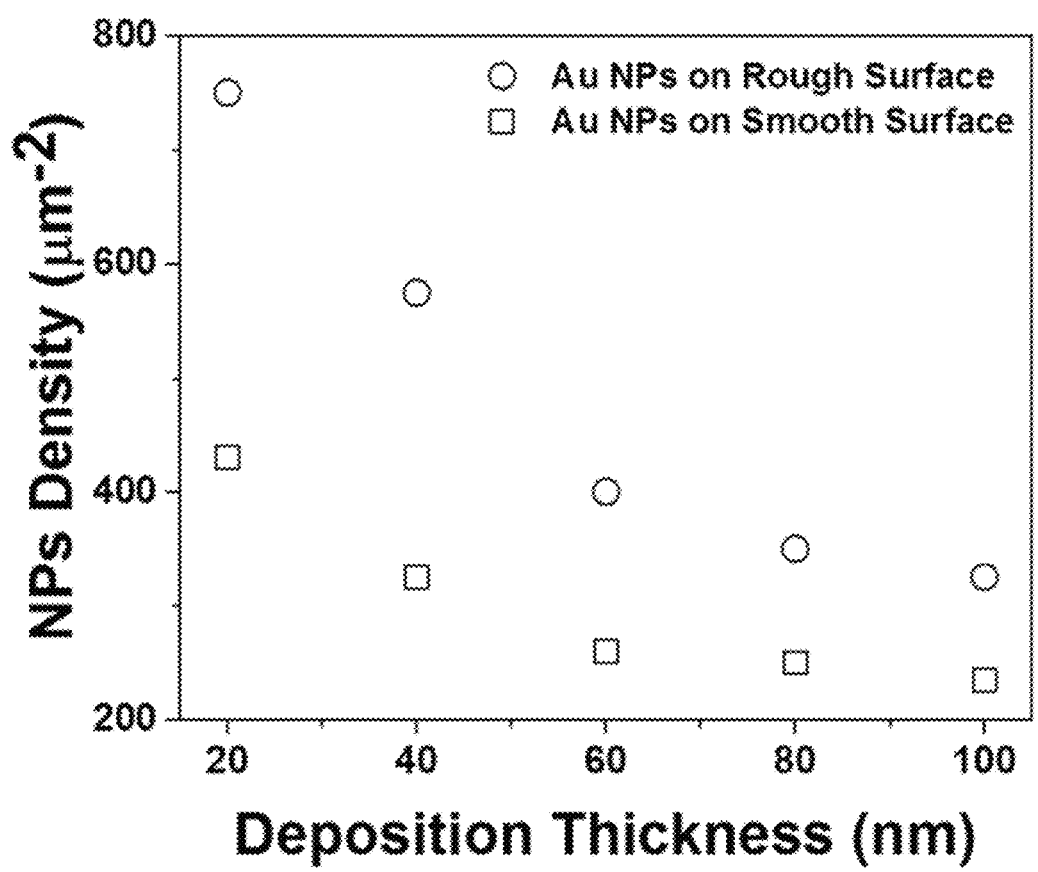
FIG. 12 is a graph illustrating surface densities of upper Au nanoparticles based on roughness of lower Au nanorods according to an embodiment of this disclosure.

FIG. 12 is a graph illustrating surface densities of upper Au nanoparticles based on surface roughness of lower Au nanorods according to an embodiment of this disclosure. It can be seen that the density of the metal nanoparticle formed on the upper part significantly increases as the surface roughness is larger in the lower structure. On the other hand, the surface density of the Au nanoparticle formed on the upper surface is small in the case of the substrate having a small surface roughness in the lower structure, but the position where the Au nanoparticles are formed is concentrated on the side surface of the Au nanorod where the plasmonic coupling effect is effectively generated. According to an embodiment of the disclosure, although the Au nanoparticles are deposited to be a thickness of 100 nm on the top part, a plasmonic multi-layered structure is provided with the surface density of the formed Au nanoparticles of 200 particles/µm$^2$ or more. Since the upper Au nanoparticles are formed to have the particle size of 40 nm or greater and to be dense, it provides a substrate that can induce a strong plasmonic coupling effect between the adjacent Au nanoparticles, and between the upper Au nanoparticles and the lower Au nanorods.

Figure 13A:
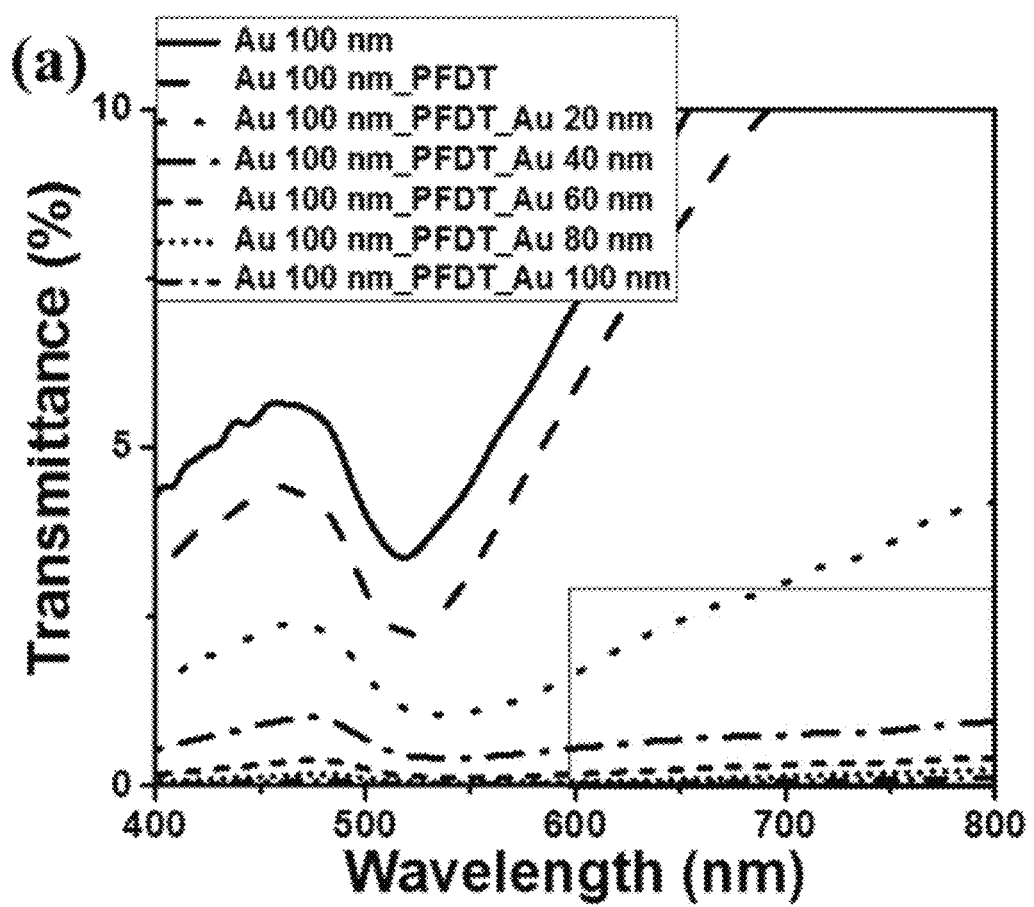
FIGS. 13A and 13B are graphs illustrating light loss (transmittance) of multi-layered Au nanostructures including smooth lower Au nanorods according to an embodiment of this disclosure.
Figure 13B:
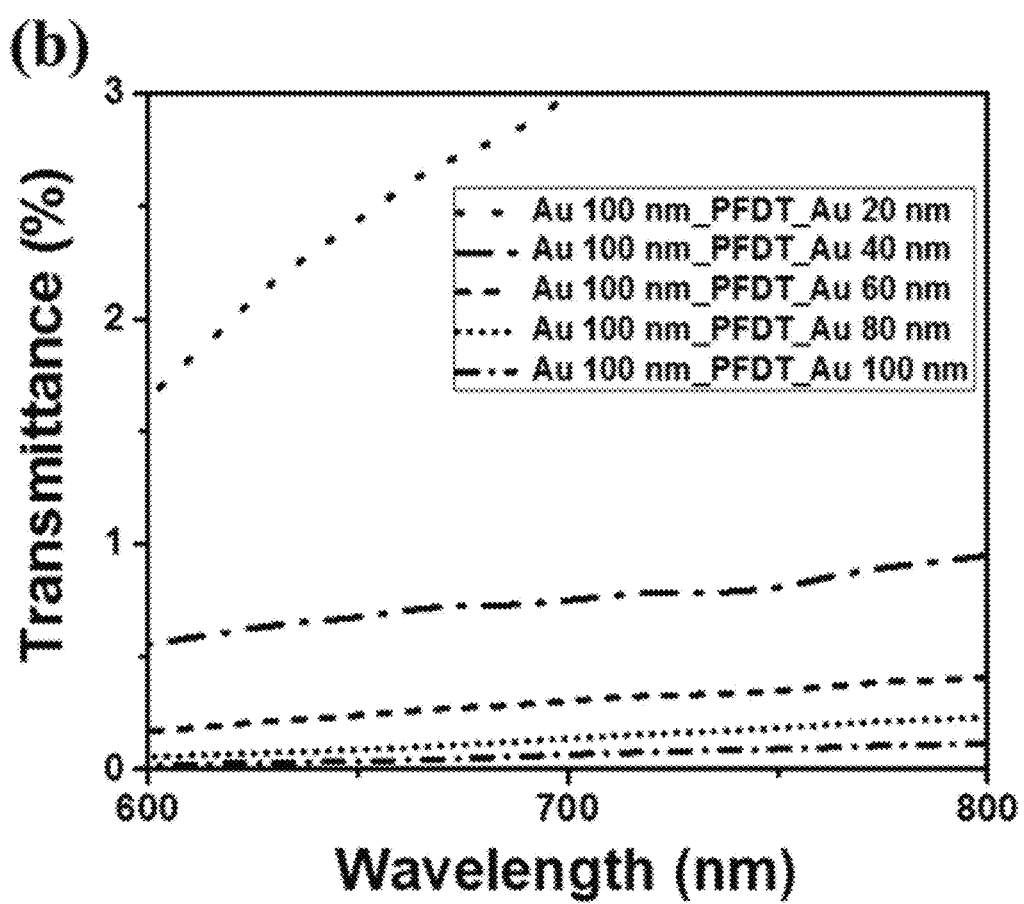

FIGS. 13A and 13B are graphs illustrating transmittance of three-dimensional multi-layered Au nanostructures according to an embodiment of this disclosure. Since the optical configuration of Raman spectroscopy is a reflection mode, the light transmittance generally means light loss. It is confirmed that when the lower 100 nm thick Au nanostructure is deposited by sputtering, the LSPR peak (dip portion of transmittance) is formed at around 520 nm (solid line in FIG. 13A). When the surface treatment with PFDT is performed, the 1 nm dielectric film is conformally formed on the Au surface, so that the LSPR peak is shifted to a long wavelength and the transmittance is decreased due to the low refractive index mismatch between PFDT and air (see the dashed line of FIGS. 13A and 13B). When the upper Au nanoparticles are formed, the transmittance of a long wavelength longer than 600 nm is rapidly decreased.

When the thickness of the upper Au is 80 nm or more, the average transmittance in the entire visible wavelength range (400 nm to 800 nm) is 0.1% or less, so that almost no light is transmitted (FIG. 13A). Because of the formation of high density spherical Au nanoparticles on the top part of the multi-layered structure, the plasmonic coupling effect between the Au nanoparticles and between the upper Au nanoparticles and the lower Au nanorods becomes maximized. Thus, the transmittance is significantly decreased due to strong absorption and scattering by LSPR. It is generally known that the higher the density of the nanometer-sized metal nanostructures, the greater the interaction with the incident light, thereby greatly increasing the SERS and plasmonic properties. FIG. 13B is an enlarged view of the rectangular region in FIG. 13A and illustrates that as the size of the upper Au nanoparticles increases, the light loss decreases rapidly.

Figure 14B:
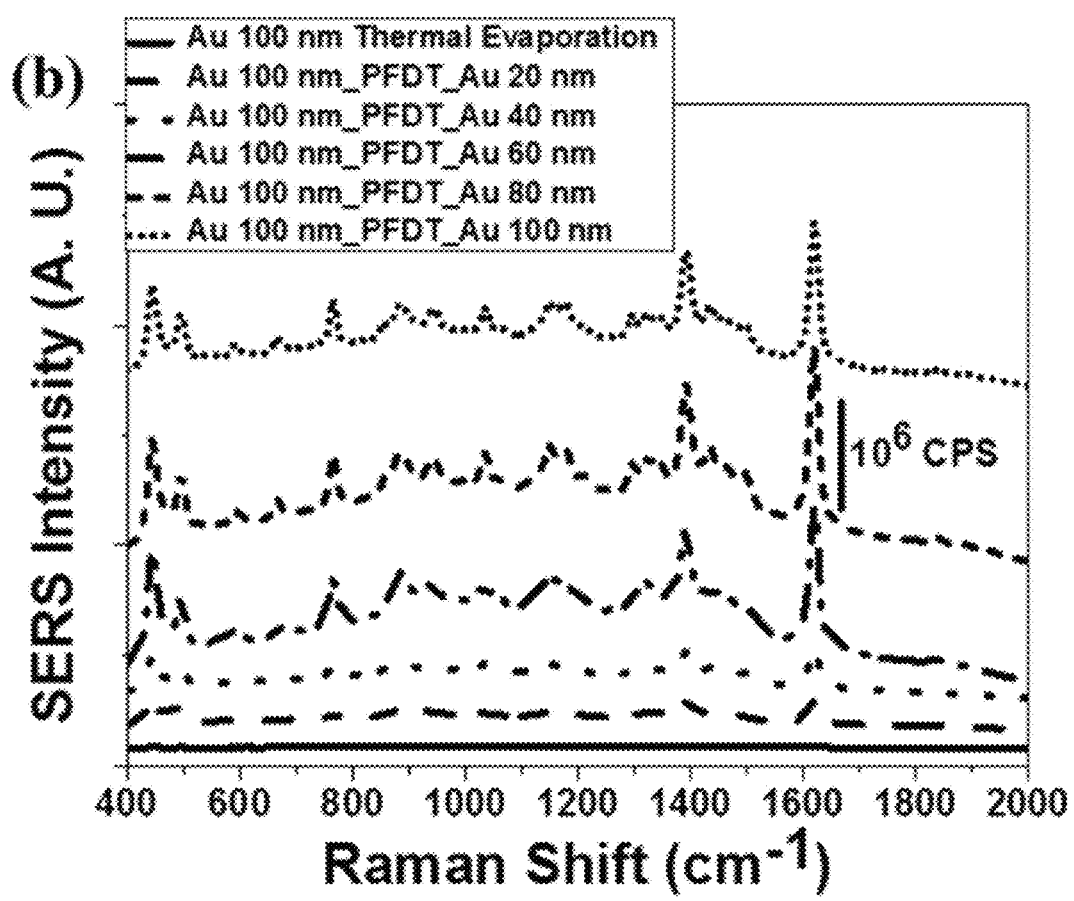

FIGS. 14A and 14B are graphs illustrating SERS characteristics of a plasmonic multi-layered Au nanostructure including a sliding dielectric film having a low surface energy according to an embodiment of this disclosure. It is noted that the multi-layered nanostructure increases the SERS signal tens of times as compared with the single-layer nanostructure. As the size of the upper Au nanoparticle increases, the SERS characteristics are improved. As the size of the upper Au nanoparticle increases, the distance to neighboring nanoparticles decreases and plasmonic coupling with the lower Au nanorods increases, so the SERS characteristics are greatly improved.

FIG. 14B is a graph illustrating the SERS characteristics according to the size of the upper Au nanoparticle formed on the nanorod having a high surface roughness of the lower structure. It is noted that the SERS characteristics are greatly improved when the Au deposition thickness is increased to 60 nm or more. Plasmonic coupling is increased by a large number of spaced-apart Au nanoparticles with the average particle size of 40.5 nm, 46.5 nm, and 55.0 nm, when the deposition thicknesses is increased to 60 nm, 80 nm, and 100 nm which are 40 nm or more, respectively.

Figure 15:
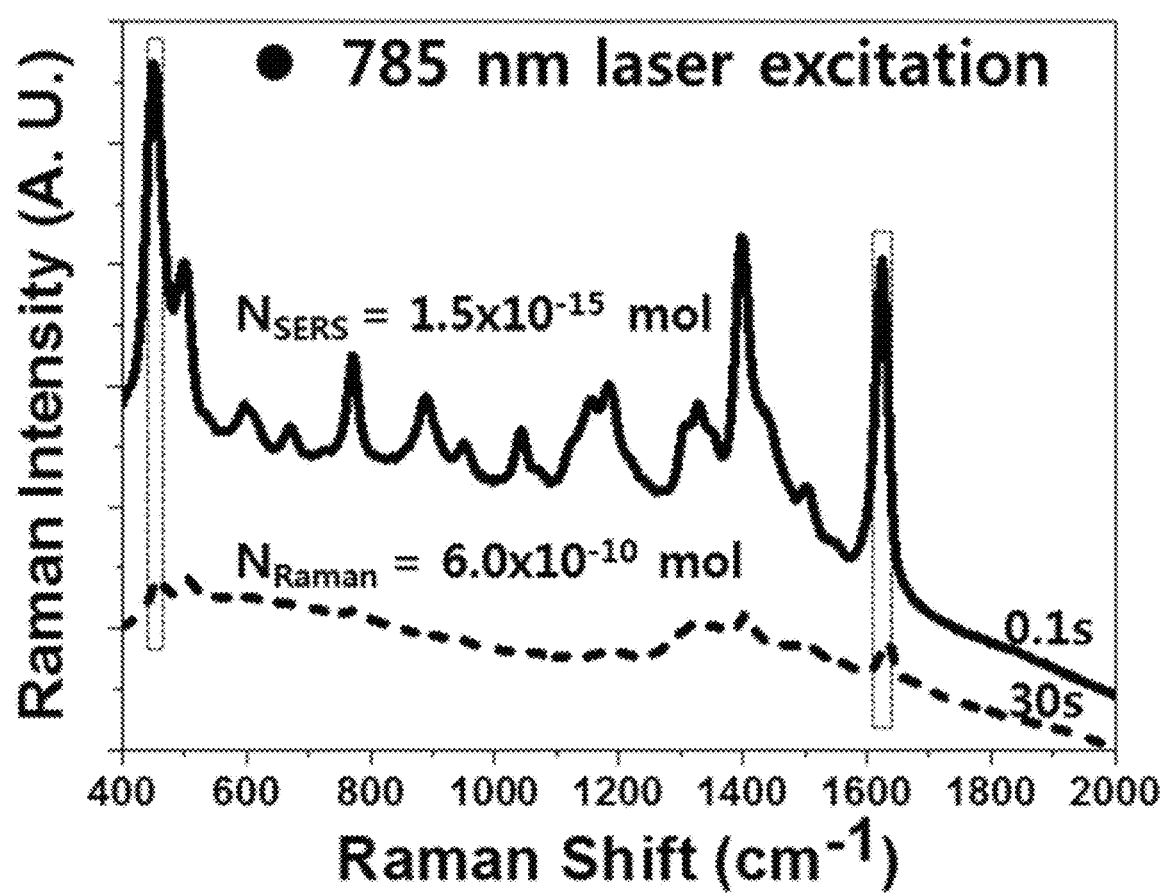
FIG. 15 is a graph comparing SERS peaks and Raman peaks determined to obtain SERS enhancement factor of a SERS substrate on which a multi-layered metal nanostructure including a sliding dielectric film is formed according to an embodiment of this disclosure.

FIG. 15 is a graph illustrating the SERS enhancement factor (EF) of a substrate on which the plasmonic multi-layered nanostructure (FIG. 11E) including a sliding dielectric film with a low surface energy is formed. SERS EF can be determined as follows.

$$EF = \left(\frac{I_{SERS}}{I_{Raman}}\right)\left(\frac{N_{Raman}}{N_{SERS}}\right)$$

$I_{SERS}$ is an intensity of the SERS signal (solid line in FIG. 15) measured after 3 μL of 5 μM methylene blue aqueous solution is spotted and dried on the SERS substrate, and $N_{SERS}$ is a number of moles of methylene blue present in the laser spot on the SERS substrate. $I_{Raman}$ is an intensity of the Raman signal (dashed line in FIG. 15) measured in a 20 wt % methylene blue solution and $N_{Raman}$ is a number of moles of methylene blue excited by the laser in a 20 wt % methylene blue solution.

The measurement conditions in this embodiment are as follows.

Excitation laser wavelength: 785 nm

Laser spot size: ~ about 20 μm

Laser power: 10 mW

SERS EF values of 9.9×10$^8$ and 5.2×10$^8$ on the basis of 420 cm$^{-1}$ and 1634 cm$^{-1}$ indicate that the SERS EF is higher than 10$^8$. It is possible to induce strong plasmonic coupling due to the formation of high density nano-gaps between the spherical metal nanoparticles of the upper part and the metal nanorods of the lower part and between the upper metal nanoparticles so that a ultra-sensitive plasmon-enhanced spectroscopic substrate having remarkably improved sensitivity is provided. In addition, since the upper Au nanoparticles having a larger particle size are formed, the hot spot volume is greatly increased compared with Au nanoparticles having a smaller particle size.

Example 5

1. Preparation of PET Nanorods

A PET polymer substrate was subjected to Ar plasma treatment, and PET nanorods were prepared under the following conditions.

Initial vacuum level: 6.8×10$^{-3}$ torr

Plasma processing of the polymer substrate

Vacuum level: 8.0×10$^{-2}$ torr

Operation gas: Ar 5 sccm

RF plasma power: 100 W

Processing time: 5 min

2. Metal (Au) Vacuum Deposition

Au was vacuum deposited on the polymer nanorods prepared above under the following conditions.

Au sputtering process

Vacuum level: 7.0×10$^{-2}$ torr

Operation gas: Ar 20 sccm

RF plasma power: 100 W

Au deposition rate: 2.0 Å/s

Au deposition thickness: 100 nm

3. Formation of a Self-Assembled Monolayer

A self-assembled monolayer is formed on the PET/Au nanorods prepared by the vacuum deposition described above under the following conditions.

Deposition material: 1H, 1H, 2H, 2H-Perfluorodecanethiol (PFDT)

vapor phase deposition conditions

10 μl of 97% PFDT was dropped onto a glass petri dish;

A 2×2 cm$^2$ Au substrate was attached to a glass petri dish lid and sealed, and the PFDT vapor was surface treated on the Au substrate for 2 hours.

4. Ag Nanoparticle Vacuum Deposition

Ag was vacuum deposited on the surface of the substrate on which the PFDT self-assembled monolayer was formed under the following conditions.

Thermal evaporation process

Vacuum level for deposition: 9.8×10$^{-6}$ torr

Metal deposition rate: 0.3 Å/s

Metal deposition thickness: 20 nm to 100 nm

FIGS. 16A, 16B, 16C, 16D, 16E, and 16F are images illustrating that the substrate on which Ag (1140 mJ/m$^2$) nanoparticles having a surface energy lower than the surface energy of Au (1400 mJ/m$^2$) are formed on a sliding dielectric film and lower Au nanorods having a smooth surface according to an embodiment of the disclosure.

Figure 16A:
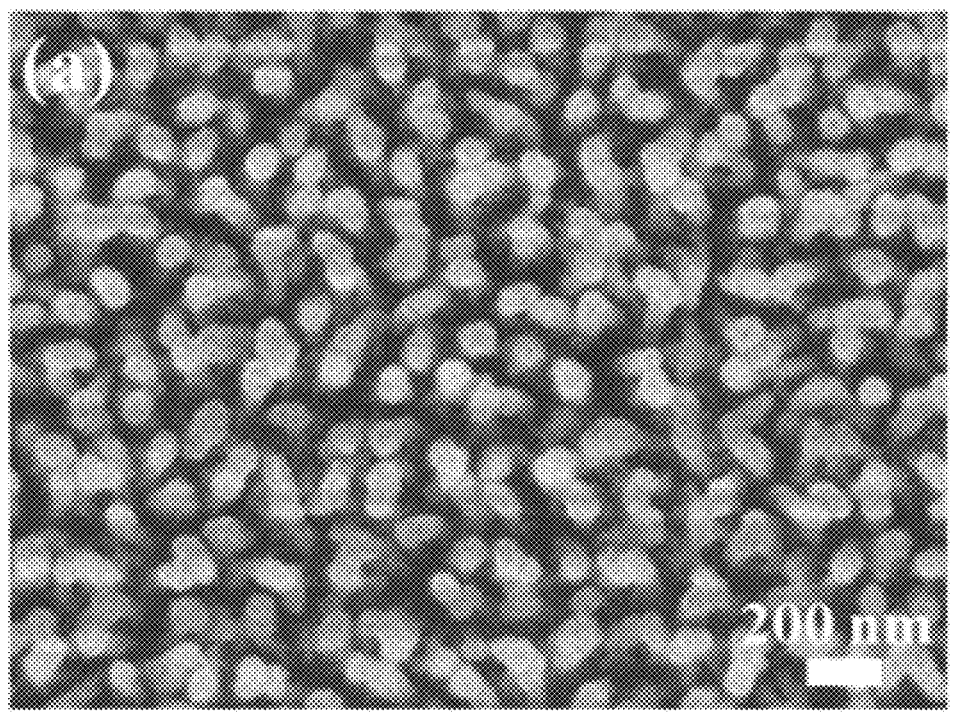
FIGS. 16A, 16B, 16C, 16D, 16E, and 16F are SEM images illustrating a substrate on which Ag nanoparticles vacuum-deposited on lower Au nanorods having smooth surface and a sliding dielectric film are formed according to an embodiment of this disclosure.
Figure 16B:
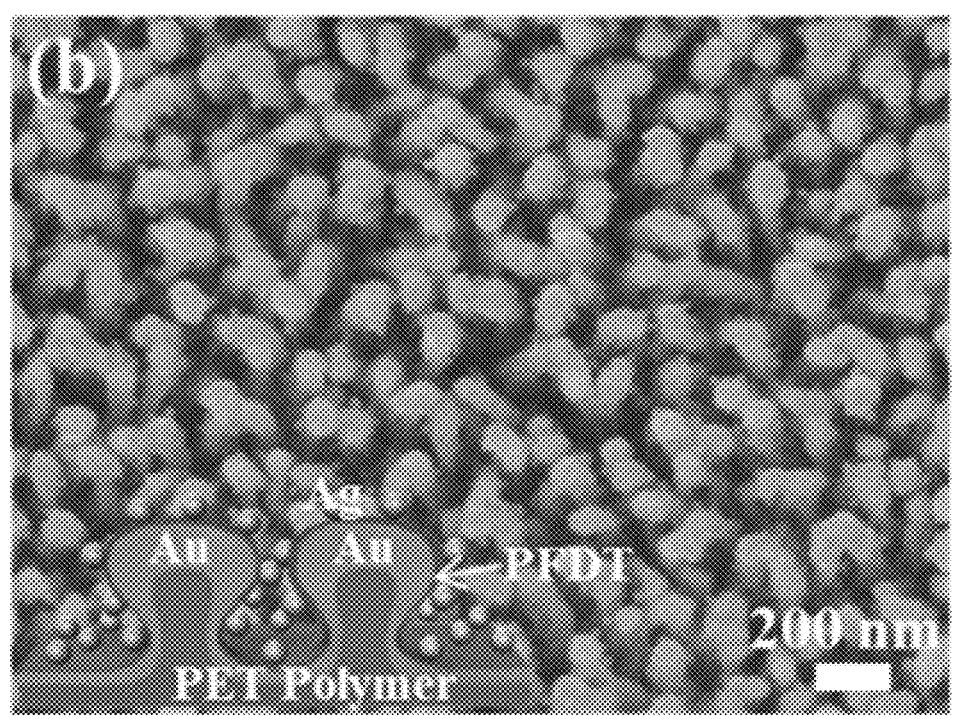
Figure 16C:
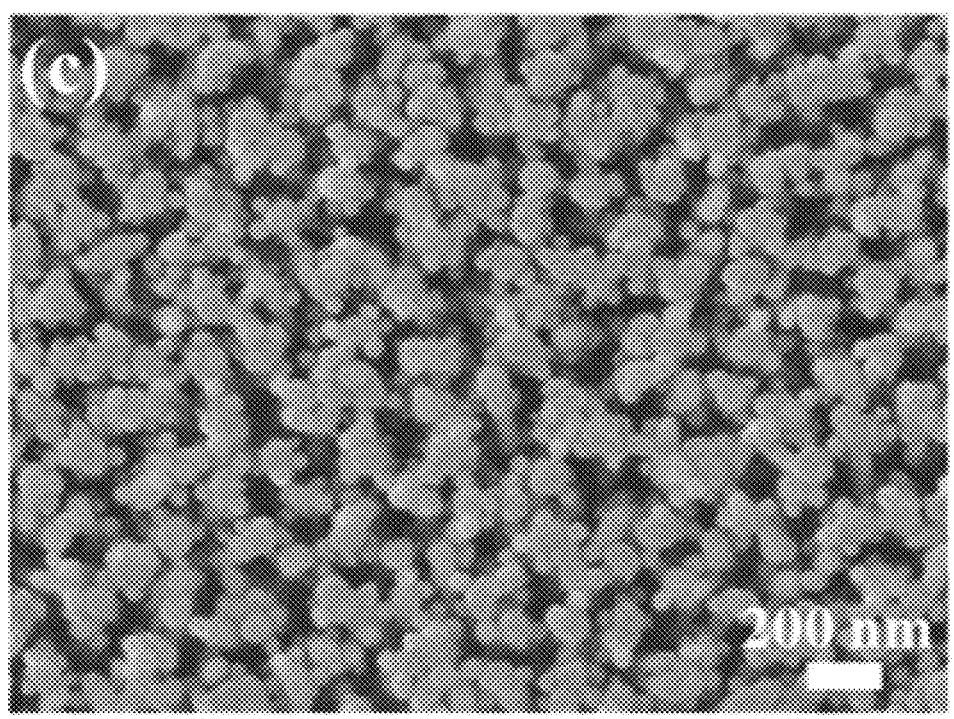
Figure 16D:
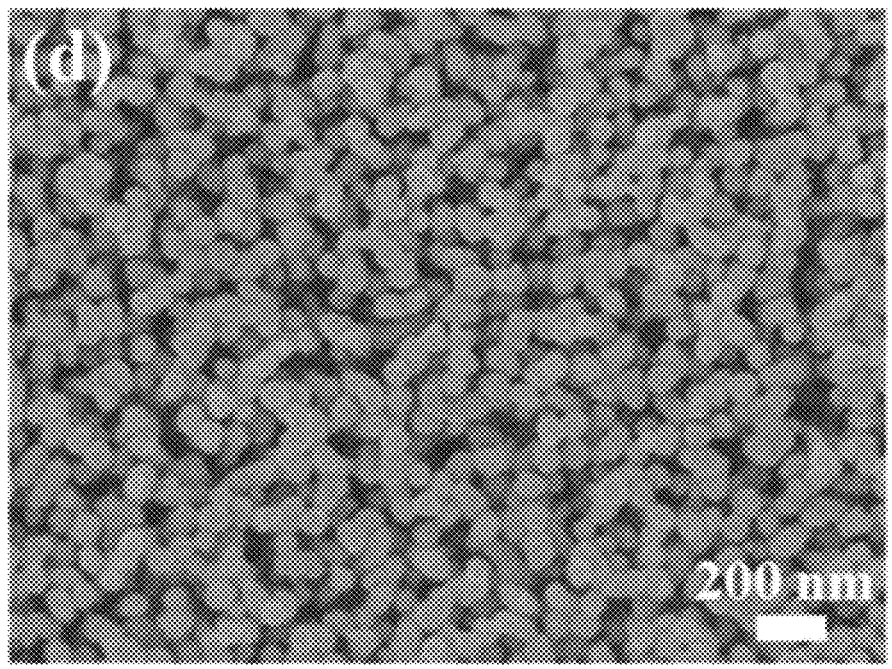
Figure 16E:
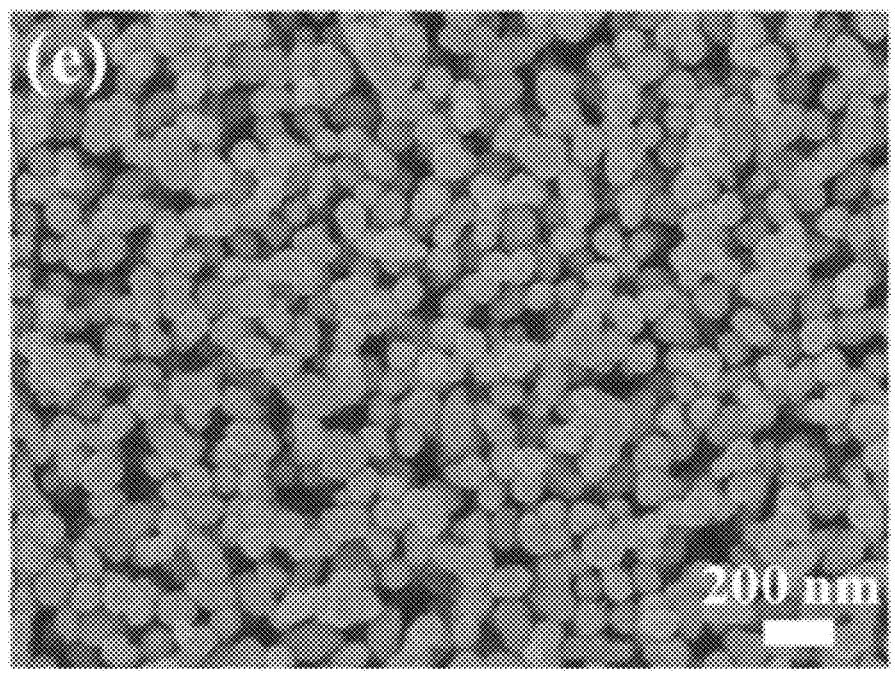
Figure 16F:
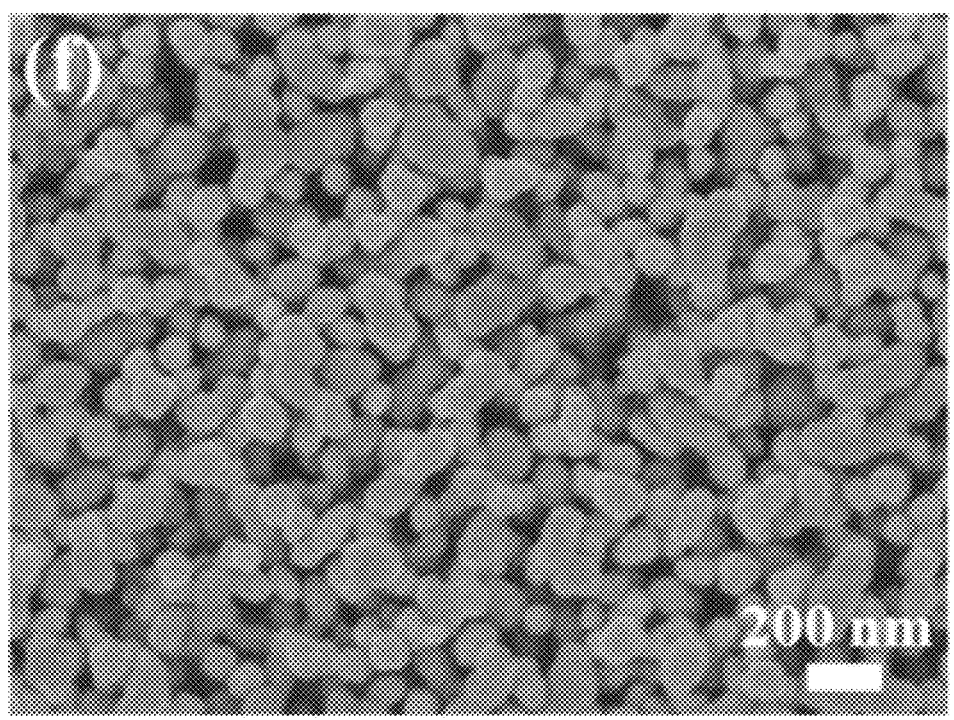
Figure 17A:
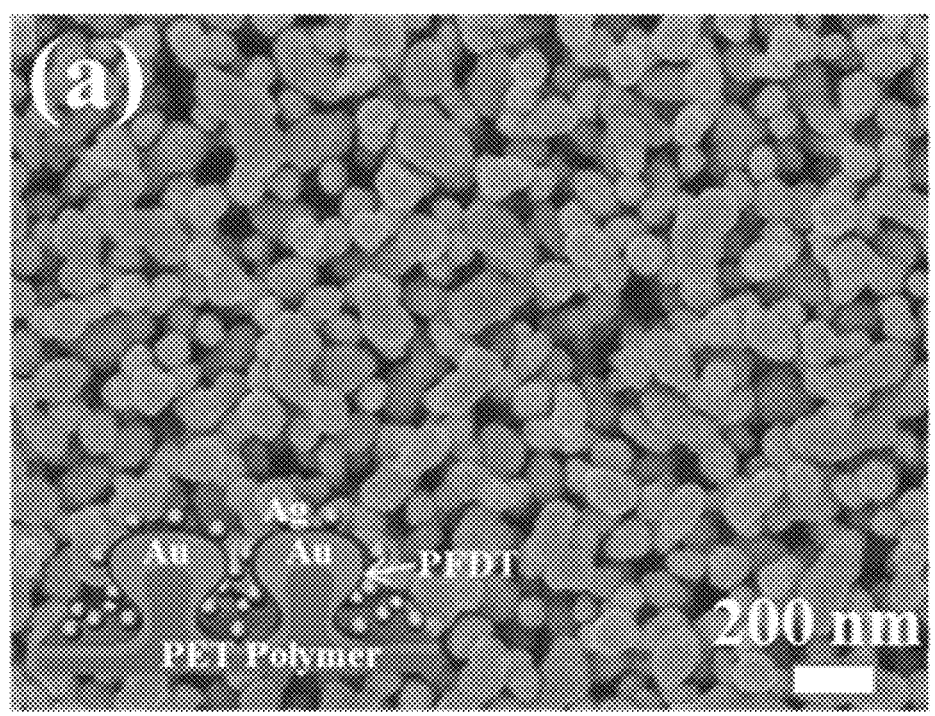
FIGS. 17A, 17B, 17C, and 17D are SEM images comparing a substrate wherein nanoparticles having a different surface energy from Ag are formed on lower Au nanorods having smooth surface and a sliding dielectric film according to an embodiment of this disclosure.
Figure 17B:
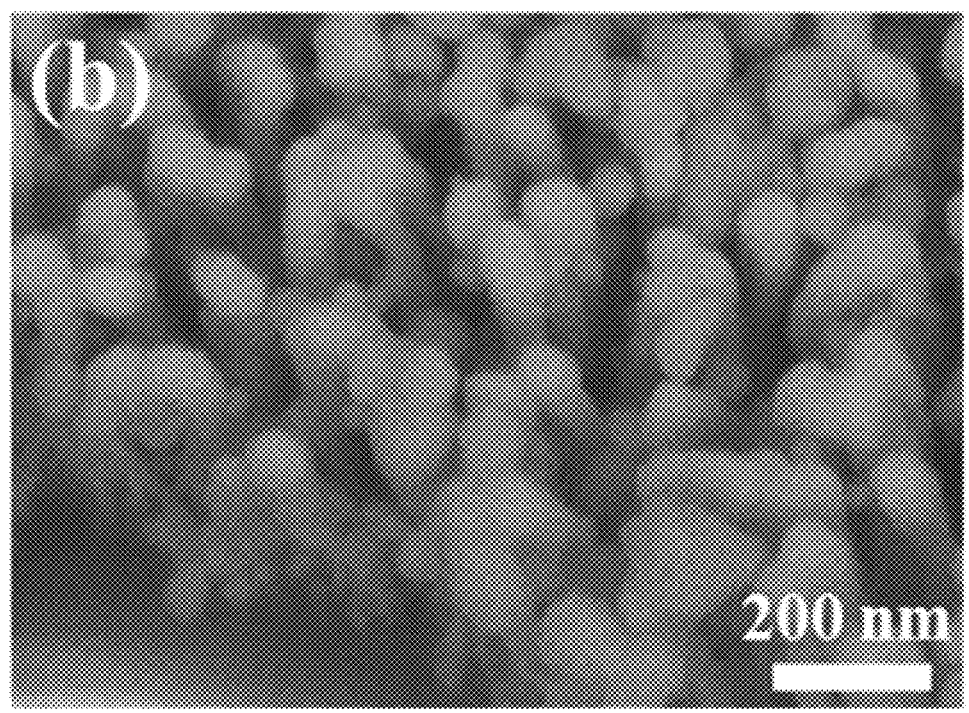
Figure 17C:
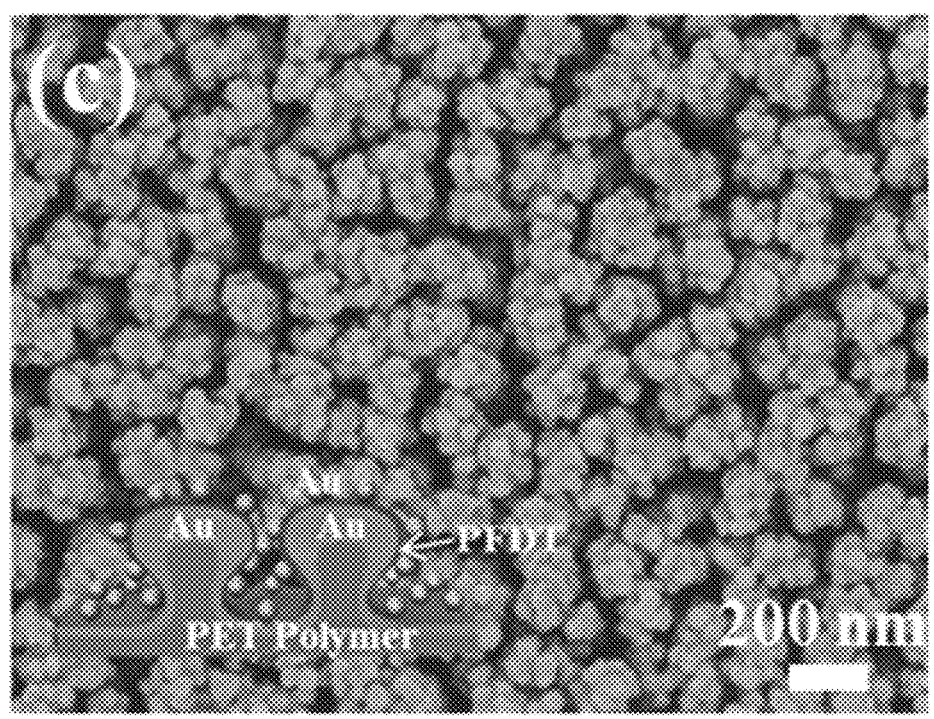
Figure 17D:
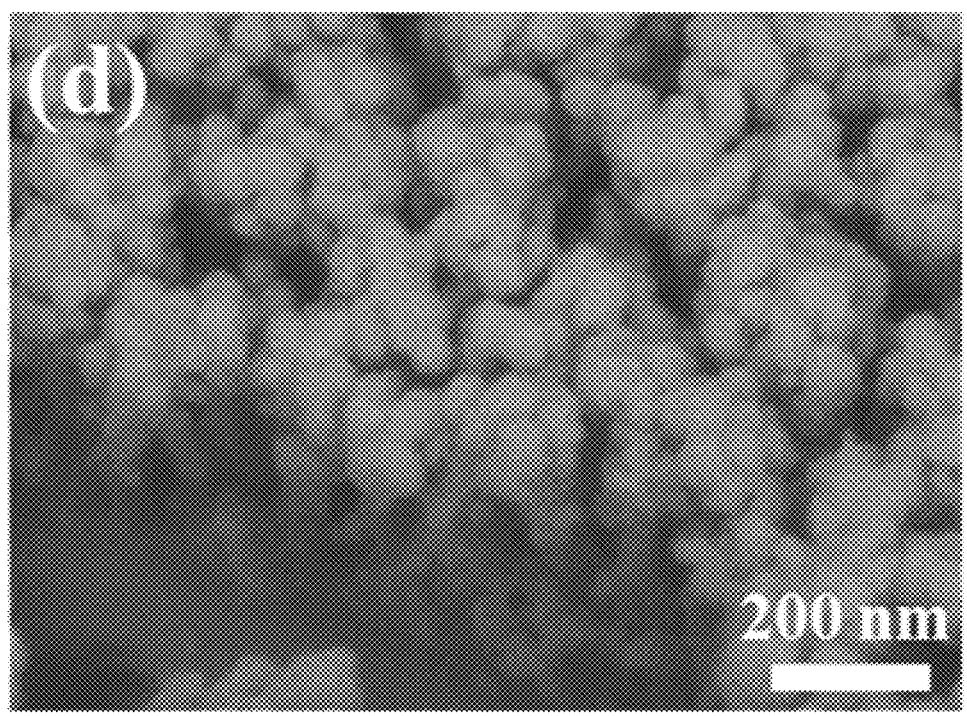

Difference in the surface energy from the sliding dielectric film is about 1125 mJ/m$^2$. The PET plasma surface processing time was increased to 5 minutes in order to form Au nanorods having a high aspect ratio and then Au was deposited by sputtering to a thickness of 100 nm (FIG. 16A). Au surface treatment was then performed with PFDT to form a PFDT self-assembled monolayer. Ag was deposited by the thermal evaporation to a thickness of 20 nm (FIG. 16B), 40 nm (FIG. 16C), 60 nm (FIG. 16D), 80 nm (FIG. 16E), and 100 nm (FIG. 16F).

It is noted that as in the case of forming the upper Au nanoparticles, the Ag nanoparticles are also intensively formed and grown at the edge of the nanorod in the lower smooth structure having a small surface roughness (FIGS. 16B, 16C, 16D, and 16E). Ag nanoparticles are coalesced with neighboring Ag nanoparticles at the thickness of 100 nm or more (FIG. 16F). When difference in the surface energy from the sliding dielectric film is about 1125 mJ/m$^2$, the surface migration of the adatoms is activated and thus formation of spherical nanoparticles at the top part tend to be easy.

FIGS. 17A, 17B, 17C, and 17D are SEM images comparing three-dimensional multi-layered structures according to the surface energy of the metal material deposited on the top part. When Ag having a surface energy of 1140 mJ/m$^2$ was deposited to a thickness of 100 nm (FIGS. 17A and 17B), the upper particles were coalesced together to form a continuous film, while when Au having a surface energy of 1400 mJ/m$^2$ was deposited to a thickness of 100 nm (FIGS. 17C and 17D), a plurality of spaced-apart Au nanoparticles are formed instead of a continuous thin film. In other words, as the surface energy of the metal deposited on the upper part is higher, the metal atoms are coalesced with each other, which reduces the coalescence with neighboring metal nanoparticles, which increases the density of the Au nanoparticles, and facilitates growth of the spherical metal nanoparticles having high density.

Comparative Example 1

Figure 18A:
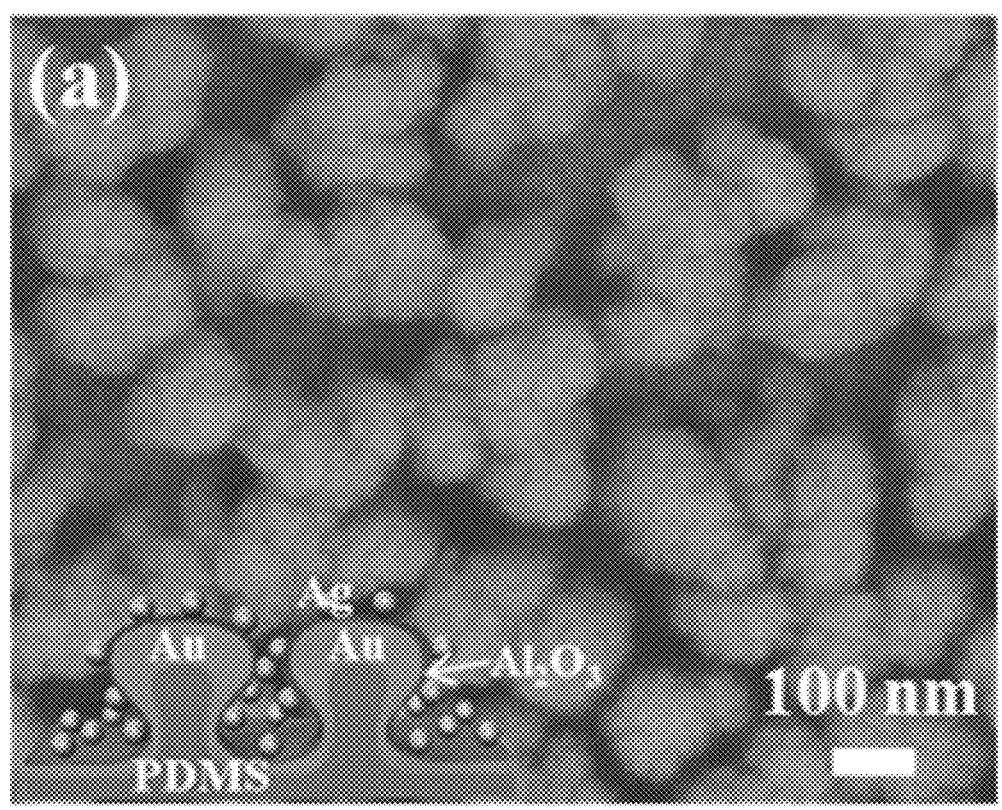
FIGS. 18A, 18B, 18C, 18D, 18E, and 18F are SEM images comparing a substrate on which upper metal nanoparticles are formed as in Comparative Example where alumina is used as an intermediate dielectric film.
Figure 18B:
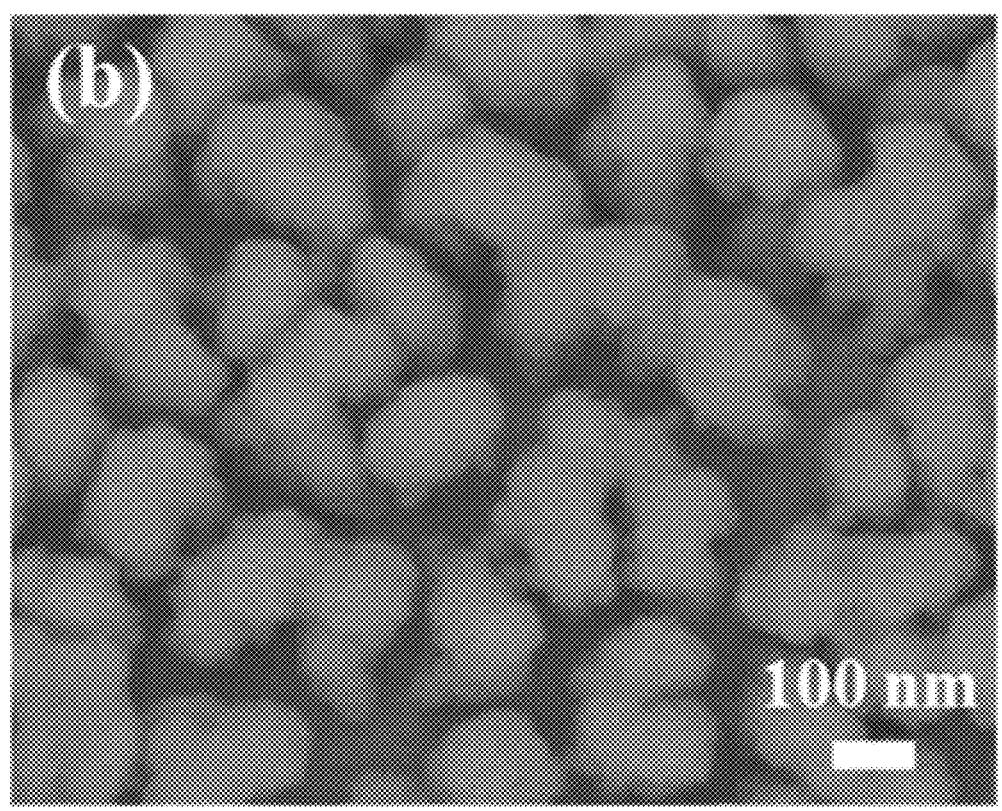
Figure 18C:
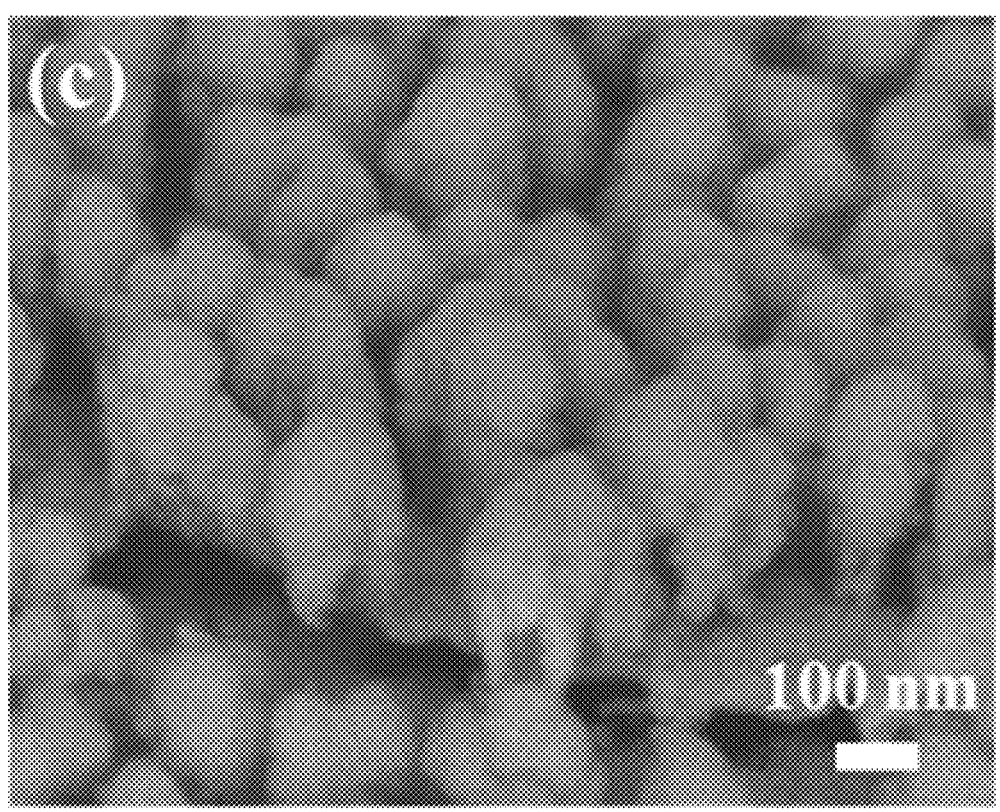
Figure 18D:
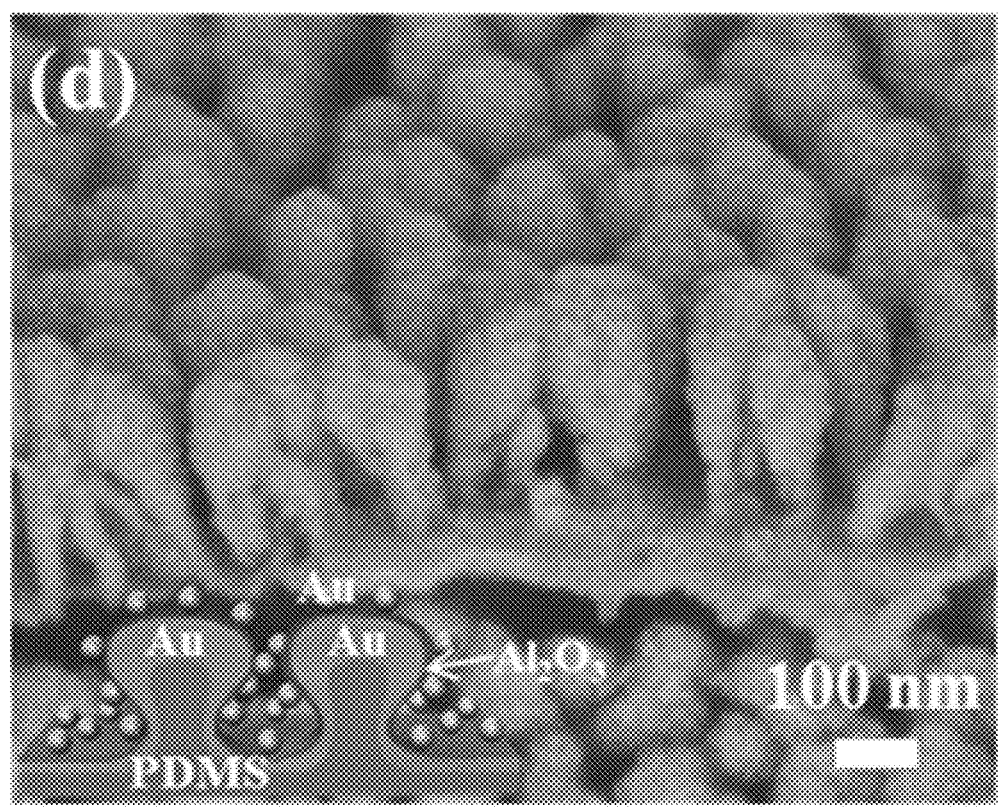
Figure 18E:
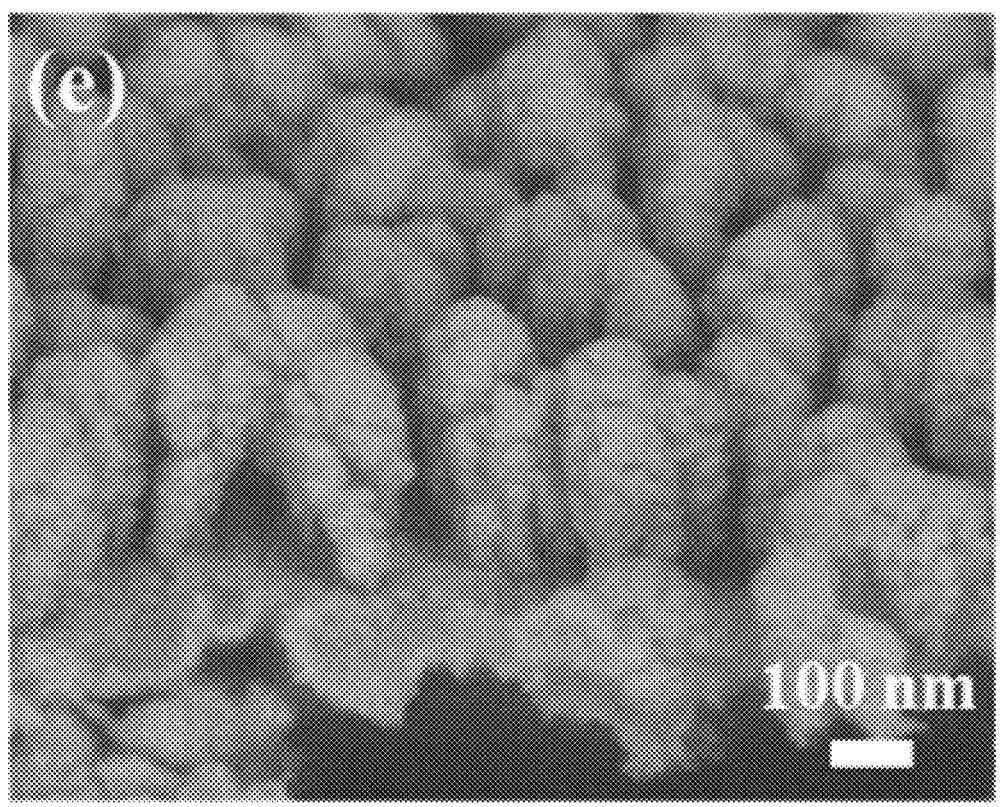
Figure 18F:
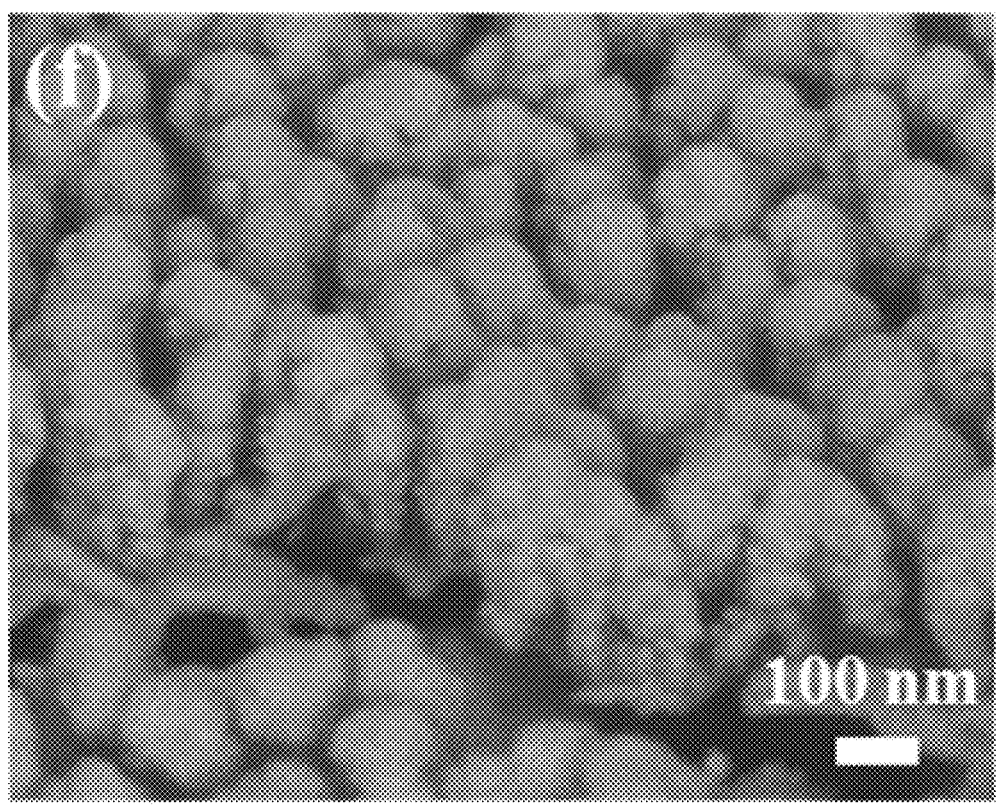

1. PDMS Reactive Ion Etching (RIE) Process
RIE vacuum level: 8×10$^{-2}$ torr
Operation gas: CF$_4$ 5 sccm
RF plasma power: 100 W
RIE time: 7 min
2. Metal (Au) Vacuum Deposition
Au was vacuum deposited on the polymer nanorods prepared by PDMS reactive ion etching (RIE) process under the following conditions.
Au sputtering process
Vacuum level: 7.0×10$^{-2}$ torr
Operation gas: Ar 20 sccm
RF plasma power: 100 W
Au deposition rate: 2.0 Å/s
Au deposition thickness: 100 nm
3. Al$_2$O$_3$ Thermal Evaporation Process
Vacuum level for deposition: 9.8×10$^{-6}$ torr
Deposition rate: 2.0 Å/s
Deposition thickness: 10 nm
4. Ag or Au Nanoparticle Vacuum Deposition
Ag or Au was vacuum deposited on the surface of the substrate on which the Al$_2$O$_3$ thermal evaporation was processed under the following conditions.
Thermal evaporation process
Vacuum level for deposition: 9.8×10$^{-6}$ torr
Metal deposition rate: 0.3 Å/s
Metal deposition thickness: 20 nm to 60 nm FIGS. 18A, 18B, 18C, 18D, 18E, and 18F are SEM images illustrating a three-dimensional substrate which was prepared by forming PDMS nanorods by the method in KR Patent No. 10-1639686 ("substrate which have multiple nano-gaps and fabricating method for the same") by Comparative Example 1, forming PDMS/Au nanorods by sputtering Au to a thickness of 100 nm, thermal evaporating a Al$_2$O$_3$ thin film to a thickness of 10 nm, and thermal evaporating a metal on the top part. Since Al$_2$O$_3$ has a surface energy of 905 mJ/m$^2$, which is very high compared to the surface energy of PFDT (14.8 mJ/m$^2$), surface migration of the metal atoms deposited on the top part is restricted. Since the PET substrate has a problem of being deformed by the high temperature generated during the Al$_2$O$_3$ thermal evaporation, PDMS with excellent thermal stability was used. When Ag was deposited to a thickness of 20 nm (FIG. 18A), Ag nanoparticles spaced-apart from each other were observed. However, when Ag was deposited to a thickness of 40 nm, a thin film was formed (FIGS. 18B and 18C).

When Au having a surface energy larger than Ag was deposited to a thickness of 20 nm (FIG. 18D), 40 nm (FIG. 18E) and 60 nm (FIG. 18F), Au nanoparticles which are more spaced-apart than Ag were formed, but a film was formed at the thickness of 40 nm or greater like Ag. That is, it is clearly noted that the difference in the surface energy between the intermediate dielectric film and the upper particles is less than 1000 mJ/m$^2$, particularly 500 mJ/m$^2$ or less, the formation and size increase of spherical nanoparticles are restricted (Table 1).

TABLE 1

Average particle size with difference in surface energy

| Deposition thickness (nm) | Difference in surface energy (Au-PFDT) 1385 mJ/m$^2$ Average particle size (nm) | Difference in surface energy (Au-Alumina) 495 mJ/m$^2$ Average particle size (nm) |
|---|---|---|
| 20 | 22 | 35 |
| 40 | 41 | — |
| 60 | 59 | — |
| 80 | 66 | — |
| 100 | 70 | — |

Figure 19:
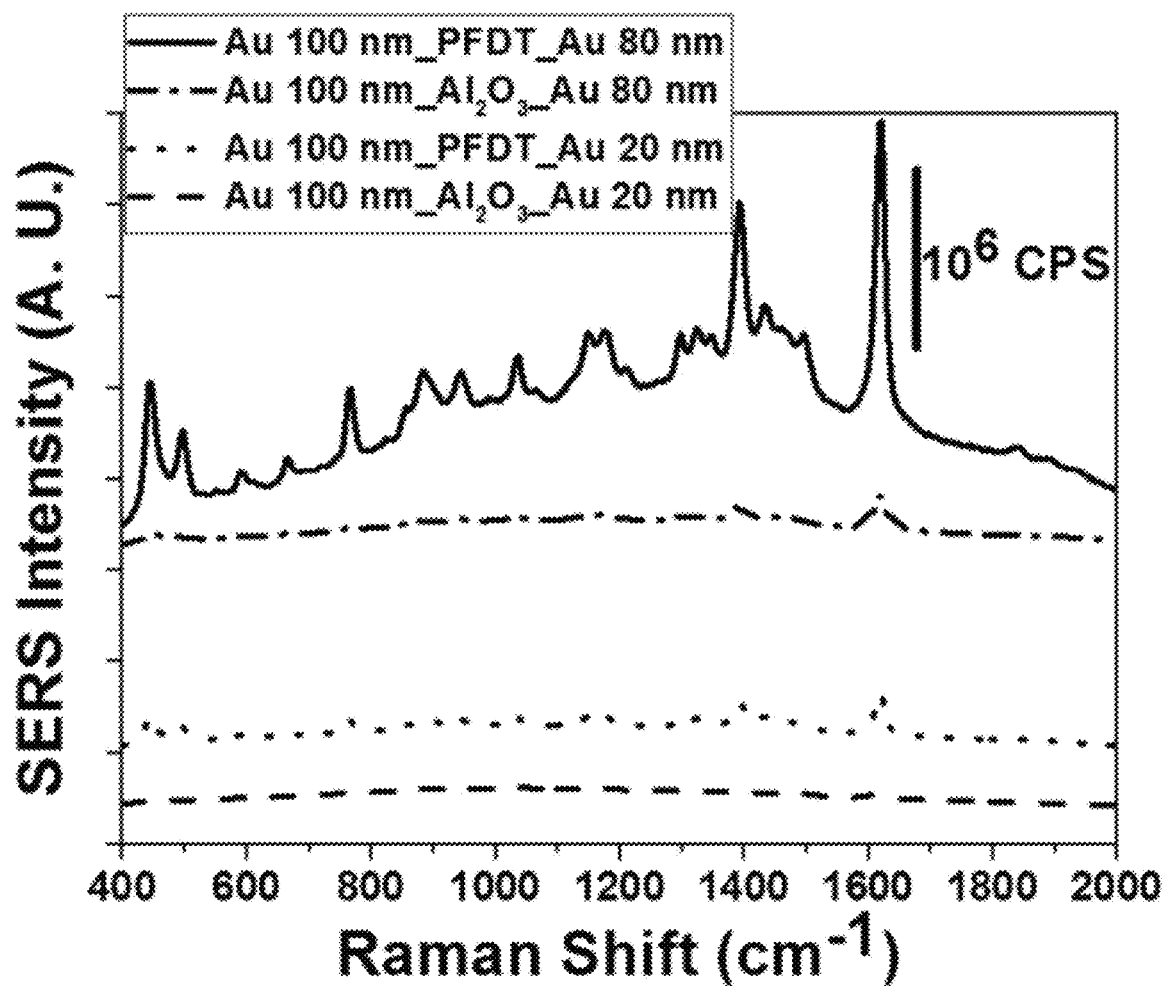
FIG. 19 is a graph comparing SERS signals according to difference in the surface energy between the upper metal particles and the intermediate dielectric film.

FIG. 19 is a graph comparing SERS enhancement factor according to difference in the surface energy of the upper metal particles and the intermediate dielectric film.

The SERS intensity was determined by spotting 3 µl of 5 µM methylene blue aqueous solution on the SERS substrate having difference in the surface energy of 495 mJ/m$^2$ between the intermediate dielectric film and the upper metal particles of Comparative Example 1 (Au—Al$_2$O$_3$) and drying the result. The SERS intensity was determined by spotting 3 µl of 5 µM methylene blue aqueous solution on the SERS substrate having difference in the surface energy of 1385 mJ/m$^2$ between the intermediate dielectric film and the upper metal particles of (Au-PFDT) according to an embodiment of this disclosure and drying the result. It is noted that the signal intensity of the multi-layered structure having a large surface energy difference is greatly increased, as compared to that of the multi-layer structure having a small surface energy difference regardless of the Au deposition thickness. The signal intensity at 20 nm of the deposition thickness was increased by 3.75 times, but the signal intensity at 80 nm of the deposition thickness was increased by 8.87 times. When the surface energy difference is as large as 1000 mJ/m$^2$, a plurality of spaced-apart spherical metal nanoparticles with a large particle size are formed on the top part, so that multiple plasmonic coupling between the upper nanoparticles and between the upper nanoparticles and the lower metal nanorods is induced to provide a ultra-sensitive plasmon-enhanced spectroscopic substrate. In addition, since the upper Au nanoparticle has a large particle size, the hot spot volume is greatly increased compared with the Au nanoparticle having a small particle size.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF REFERENCE NUMERALS 200, 300: Substrate with a sliding dielectric film
210, 310: Substrate
220, 320: Sliding dielectric film
230, 330: Nanoparticle
232: Adatom
332: Metal atom
312: Nanostructure
314: Metal-containing thin film
314a: Groove
316: Metal-containing nanostructure

What is claimed is:

1. A substrate with a sliding dielectric film comprising:
a substrate, the substrate being a polymer or a resin;
a first metal-containing thin film formed on a surface of the substrate;
a sliding dielectric film with a lower surface energy compared to the surface energy of a nanoparticle formed on the substrate; and
the nanoparticle formed on the sliding dielectric film and having an average particle size of 40 nm or greater,
wherein the surface energy of the nanoparticle is at least 1000 mJ/m$^2$ greater than the surface energy of the sliding dielectric film, and
wherein the first metal-containing thin film includes concave grooves in grain boundary regions.

2. The substrate of claim 1, wherein the surface energy of the sliding dielectric film is 100 mJ/m$^2$ or less.

3. The substrate of claim 1, wherein the sliding dielectric film is formed of at least one selected from alkanethiol, alkyldisulfide, fluorocarbon thiol, fluorocarbon silane, chlorocarbon silane, fluorocarbon carboxylic acid, fluorocarbon amine, fluorocarbon polymer and a derivative thereof.

4. The substrate of claim 1, wherein a thickness of the sliding dielectric film is 0.5 nm to 100 nm.

5. The substrate of claim 1, wherein the sliding dielectric film is formed by vapor deposition or solution process.

6. The substrate of claim 1, further comprising a plurality of nanostructures formed on the surface of the substrate, each nanostructure of the plurality of nanostructures being spaced-apart from each other.

7. The substrate of claim 6, wherein the plurality of nanostructures are formed by plasma etching, soft lithography, nanoimprint lithography, photo lithography, or holographic lithography.

8. The substrate of claim 6, further comprising the first metal-containing thin film formed on a surface of the nanostructure.

9. The substrate of claim 1, wherein the first metal-containing thin film is formed by vacuum depositing a Raman active material.

10. The substrate of claim 9, wherein the Raman active material is Au, Ag, or an alloy thereof.

11. The substrate of claim 9, wherein the first metal-containing thin film is formed by vacuum depositing the Raman active material to a thickness of 10 nm or more.

12. The substrate of claim 1, further comprising a second metal-containing thin film formed between the substrate and the first metal-containing thin film,
wherein the second metal-containing thin film has a lower surface energy than the first metal-containing thin film.

13. The substrate of claim 12, wherein the second metal-containing thin film is formed of one selected from Ag, Cu, Pt, Pd, Ti, and an alloy thereof.

14. The substrate of claim 1, wherein the nanoparticle is a metal-containing nanoparticle.

15. The substrate of claim 1, wherein the nanoparticle is formed by vacuum depositing a Raman active material.

16. The substrate of claim 15, wherein the Raman active material is Au, Ag or an alloy thereof.

17. A method for manufacturing a substrate with a sliding dielectric film of claim 1, the method comprising:
forming the substrate, the substrate being a polymer or a resin;
forming a first metal-containing thin film formed on a surface of the substrate;
forming a sliding dielectric film with a low surface energy on the substrate; and
forming a nanoparticle on the sliding dielectric film, the nanoparticle having an average particle size of 40 nm or greater,
wherein the surface energy of the nanoparticle is at least 1000 mJ/m$^2$ greater than the surface energy of the sliding dielectric film.

18. The substrate of claim 1, wherein the nanoparticle is formed on one of the concave grooves of the substrate by surface migration on the sliding dielectric film.

* * * * *